United States Patent
Ayoub et al.

(10) Patent No.: US 9,134,958 B2
(45) Date of Patent: Sep. 15, 2015

(54) BID TO BCD/DPD CONVERTERS

(71) Applicant: SilMinds, LLC, Cairo (EG)

(72) Inventors: Ahmed A. Ayoub, Cairo (EG); Hossam Aly Hassan Fahmy, Cairo (EG)

(73) Assignee: SilMinds, Inc., Las Vegas, NV (US)

( * ) Notice: Subject to any disclaimer, the term of this patent is extended or adjusted under 35 U.S.C. 154(b) by 190 days.

(21) Appl. No.: 13/657,458

(22) Filed: Oct. 22, 2012

(65) Prior Publication Data

US 2014/0115023 A1  Apr. 24, 2014

(51) Int. Cl.
G06F 7/50  (2006.01)
G06F 7/38  (2006.01)

(52) U.S. Cl.
CPC .................... G06F 7/38 (2013.01)

(58) Field of Classification Search
CPC ........... G06F 7/42; G06F 7/4912; G06F 7/50; G06F 7/544; G06F 11/104
USPC ......................................................... 708/683
See application file for complete search history.

(56) References Cited

U.S. PATENT DOCUMENTS

| | | | |
|---|---|---|---|
| 3,276,013 A | 9/1966 | Chandler | |
| 3,373,269 A | 3/1968 | Rathbun | |
| 3,524,976 A | 8/1970 | Wang | |
| 3,564,225 A | 2/1971 | Watson, Jr. | |
| 3,579,267 A | 5/1971 | Wright | |
| 3,611,349 A | 10/1971 | David | |
| 3,624,374 A | 11/1971 | Steiner | |
| 3,627,998 A | 12/1971 | Hemdal | |
| 3,638,002 A | 1/1972 | Toole | |
| 3,649,822 A | 3/1972 | Mersten | |
| 3,684,878 A | 8/1972 | Schipper | |
| 3,697,733 A | 10/1972 | Toole | |
| 3,705,299 A | 12/1972 | Bastian et al. | |
| 3,866,213 A | 2/1975 | Sather et al. | |
| 3,932,739 A | 1/1976 | Lutz et al. | |
| 4,016,560 A | 4/1977 | Fowler | |
| 4,069,478 A | 1/1978 | Miller | |
| 4,325,056 A | 4/1982 | Wiener | |
| 4,331,951 A | 5/1982 | Flora et al. | |
| 4,430,643 A | 2/1984 | Sevilla | |
| 4,719,450 A | 1/1988 | Yamauchi | |
| 4,792,793 A | 12/1988 | Rawlinson et al. | |
| 4,805,131 A * | 2/1989 | Adiletta et al. | 708/685 |
| 5,251,321 A | 10/1993 | Boothroyd et al. | |
| 6,369,725 B1 | 4/2002 | Busaba | |
| 6,437,715 B1 | 8/2002 | Cowlishaw | |
| 6,525,679 B1 | 2/2003 | Cowlishaw | |
| 7,477,171 B2 | 1/2009 | Mathew et al. | |
| 7,660,838 B2 | 2/2010 | Carlough et al. | |
| 7,698,352 B2 | 4/2010 | Carlough et al. | |

(Continued)

OTHER PUBLICATIONS

V. Carreno and P. Miner, "Specification of the ieee-854 floating-point standard in hol and pvs," High Order Logic Theorem Proving and Its Applications, Sep. 1995. (16 pages).

(Continued)

Primary Examiner — Tan V. Mai
(74) Attorney, Agent, or Firm — Osha Liang LLP

(57) ABSTRACT

A method and system for binary to binary coded decimal (BCD) conversion. The conversion includes: obtaining a binary input vector; generating, by a binary/BCD hardware converter, a plurality of BCD vectors based on the binary input vector; and calculating a BCD output vector based on the plurality of BCD vectors.

20 Claims, 16 Drawing Sheets

(56) References Cited

U.S. PATENT DOCUMENTS

2010/0312812 A1*  12/2010  Wang .......................... 708/505
2012/0011187 A1*  1/2012  Mohamed et al. ............ 708/523

OTHER PUBLICATIONS

IEEE, "IEEE standard for floating-point arithmetic," IEEE Std 754-2008, pp. 1-58, Aug. 2008. (50 pages).

M. Cowlishaw, "General decimal arithmetic specification," World Wide Web. http://www2.hursley.ibm.com/decimal/decarith.-html. register LSD correction transfer digit need to store ge5i signed-digit adder c register t recoders r, Jul. 2008. (10 pages).

M. Cowlishaw, "A summary of densely packed decimal encoding," IEE Proceedings Computers and Digital Techniques, ISSN, pp. 1350-2387, Apr. 2002. (3 pages).

J. Couleur, "Bidec-a binary-to-decimal or decimal-to-binary converter," Electronic Computers, IRE Transactions on, No. 4, pp. 313-316, Aug. 1958. (4 pages).

H. Guild, "Fast decimal-binary conversion," Electronics Letters, vol. 5, No. 18, pp. 427-428, Sep. 1969. (2 pages).

V. Rhyne, "Serial binary-to-decimal and decimal-to-binary conversion," Computers, IEEE Transactions on, vol. 100, No. 9, pp. 808-812, Sep. 1970. (5 pages).

J. Nicoud, "Iterative arrays for radix conversion," Computers, IEEE Transactions on, vol. 100, No. 12, pp. 1479-1489, Dec. 1971. (11 pages).

M. Benedek, "Developing large binary to bcd conversion structures," IEEE Transactions on Computers, Jul. 1977. (9 pages).

M. Schmookler, "High-speed binary-to-decimal conversion," Computers, IEEE Transactions on, vol. 100, No. 5, pp. 506-508, May 1968. (3 pages).

O. Al-Khaleel, Z. Al-Qudah, M. Al-Khaleel, C. Papachristou, and F. Wolff, "Fast and compact binary-to-bcd conversion circuits for decimal multiplication," in Computer Design (ICCD), 2011 IEEE 29th International Conference on, pp. 226-231, IEEE, Oct. 2011. (6 pages).

G. Jaberipur and A. Kaivani, "Binary-coded decimal digit multipliers," Computers & Digital Techniques, IET, vol. 1, No. 4, pp. 377-381, Jul. 2007. (5 pages).

R. James, T. Shahana, K. Jacob, and S. Sasi, "Decimal multiplication using compact bcd multiplier," in Electronic Design, 2008. ICED 2008. International Conference on, pp. 1-6, IEEE, Dec. 2008. (6 pages).

S. Veeramachaneni and M. Srinivas, "Novel high-speed architecture for 32-bit binary coded decimal (bcd) multiplier," in Communications and Information Technologies, 2008. ISCIT 2008. International Symposium on, pp. 543-546, IEEE, Oct. 2008. (4 pages).

J. Bhattacharya, A. Gupta, and A. Singh, "A high performance binary to bcd converter for decimal multiplication," in VLSI Design Automation and Test (VLSIDAT), 2010 International Symposium on, pp. 315-318, IEEE, Apr. 2010. (4 pages).

* cited by examiner

| Line No. | Input Code (Octal) | Output Code (Octal) |
|---|---|---|
| 0 | 00 | 00 |
| 1 | 01 | 01 |
| 2 | 02 | 02 |
| 3 | 03 | 03 |
| 4 | 04 | 04 |
| 5 | 05 | 10 |
| 6 | 06 | 11 |
| 7 | 07 | 12 |
| 8 | 10 | 13 |
| 9 | 11 | 14 |
| 10 | 12 | 20 |
| 11 | 13 | 21 |
| 12 | 14 | 22 |
| 13 | 15 | 23 |
| 14 | 16 | 24 |
| 15 | 17 | 30 |
| 16 | 20 | 31 |
| 17 | 21 | 32 |
| 18 | 22 | 33 |
| 19 | 23 | 34 |
| 20 | 24 | 40 |
| 21 | 25 | 41 |
| 22 | 26 | 42 |
| 23 | 27 | 43 |
| 24 | 30 | 44 |
| 25 | 31 | 50 |
| 26 | 32 | 51 |
| 27 | 33 | 52 |
| 28 | 34 | 53 |
| 29 | 35 | 54 |
| 30 | 36 | 60 |
| 31 | 37 | 61 |
| 32 | 40 | 62 |
| 33 | 41 | 63 |
| 34 | 42 | 64 |
| 35 | 43 | 70 |
| 36 | 44 | 71 |
| 37 | 45 | 72 |
| 38 | 46 | 73 |
| 39 | 47 | 74 |

E6 Decoding Block Truth Table
420

FIG. 4C

BID TO BCD/DPD CONVERTERS

BACKGROUND

Decimal arithmetic has a growing need in many commercial applications, financial applications, green energy applications, billing applications, and database systems where binary arithmetic is not sufficient because of the inexact mapping between some decimal and binary numbers. For example, the decimal number 0.1 does not have an exact binary representation. Moreover, decimal arithmetic is the norm of human calculations.

SUMMARY OF INVENTION

In general, in one aspect, the invention relates to a method. The method comprises: obtaining a binary input vector; generating, by a binary/binary coded decimal (BCD) hardware converter, a plurality of BCD vectors based on the binary input vector; and calculating a BCD output vector based on the plurality of BCD vectors.

In general, in one aspect, the invention relates to a system. The system comprises: a binary/binary coded decimal (BCD) hardware converter configured to: obtain a binary input vector; generate a plurality of BCD vectors based on the binary input vector; and calculating a BCD output vector based on the plurality of BCD vectors.

Other aspects of the invention will be apparent from the following description and the appended claims.

BRIEF DESCRIPTION OF DRAWINGS

FIG. 4C shows an E6 decoding block truth-table in accordance with one or more embodiments of the invention.

DETAILED DESCRIPTION

Figure 1:
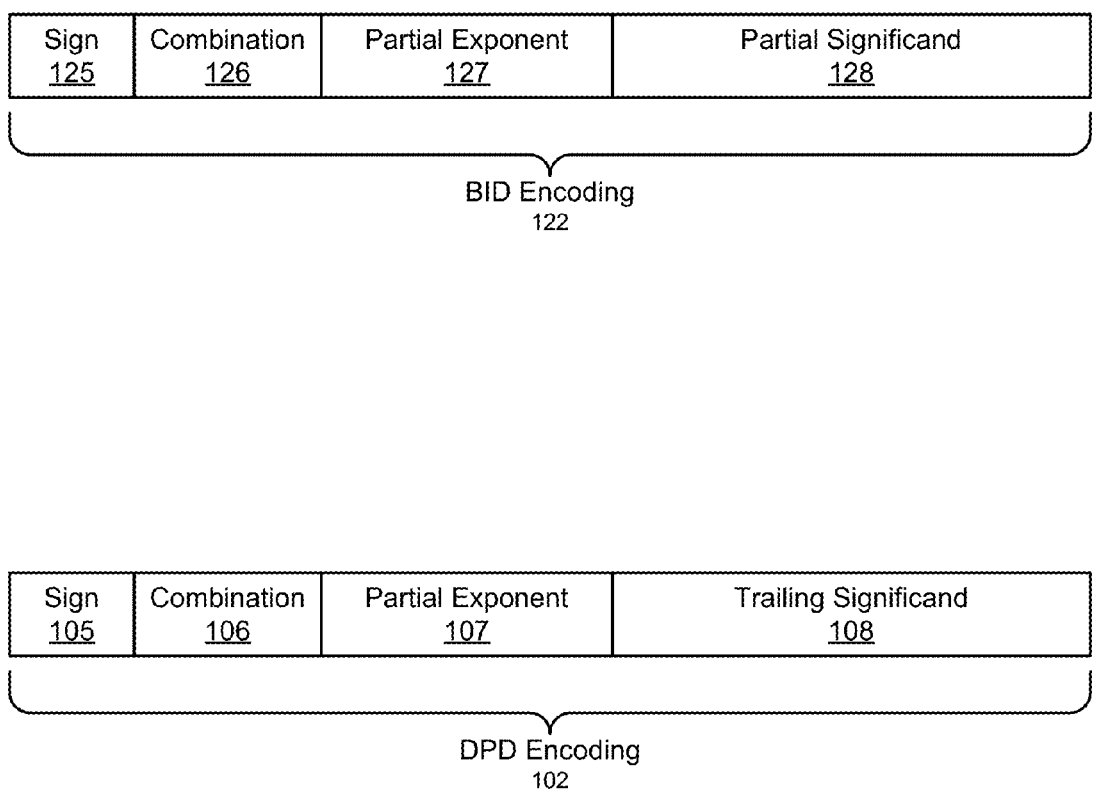
FIG. 1 shows a densely packed decimal (DPD) encoding and a binary integer decimal (BID) encoding in accordance with one or more embodiments of the invention.

Specific embodiments of the invention will now be described in detail with reference to the accompanying figures. Like elements in the various figures are denoted by like reference numerals for consistency.

In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

The value of a decimal floating point number may be expressed as $(-1)^S \times 10^{(E-bias)} \times C$, where S is 0 for a positive decimal floating point number and 1 for a negative decimal floating point number, E is a non-negative biased exponent, bias is a constant value added to the true exponent that results in E, and C is the significand (i.e., a series of decimal digits). The decimal floating point number may be represented in a densely packed decimal (DPD) encoding or a binary integer decimal (BID) encoding.

FIG. 1 shows a BID encoding (122) in accordance with one or more embodiments of the invention. The BID encoding (122) may be 32 bits (i.e., BID32), 64 bits (i.e., BID64), 128 bits (i.e., BID128), 256 bits (i.e., BID256), etc. in size. As shown in FIG. 1, the BID encoding (122) has a sign field (125), a combination field (126), a partial exponent field (127), and a partial significand field (128). The sign field (125) is a single bit and stores 0 for a positive value or 1 for a negative value.

If the two bits immediately following the sign field (125) are "00", "01", or "10", then the combination field (126) is only two bits in size, and the bits of the biased exponent correspond to the concatenation of the combination field (126) and the partial exponent field (127). If the two bits immediately following the sign field (125) are "11", the combination field (126) is four bits in size, and the bits of the biased exponent correspond to the concatenation of the least significant two bits of the combination field (126) with the bits in the partial exponent field (127). The size of the partial exponent field (127) depends on the size of the BID encoding. For example, in BID64 and BID128, the partial exponent field (127) is 8 bits and 12 bits in size, respectively. If the four bits immediately following the sign field (125) are "1111", the BID encoding (122) is representing ±infinity or "not a number" (i.e., NaNs).

If the leading bit of the significand is "0", the "0" is omitted and the partial significand field (128) stores the remaining bits. In other words, when the leading two bits of the combination field (126) are not "11", the true significand is the bits of the partial significand field (128) with an implicit leading "0". The implicit leading "0" may be referred to as a hidden bit. If the leading bits of the significand are "100", the "100" is omitted, the partial significand field (128) stores the remaining bits of the significand, and the leading two bits of the combination field (126) are set to "11". In other words, when the leading two bits of the combination field (126) are "11", the true significand is the bits of the partial significand field (128) with an implicit leading "100". The implicit leading "100" may be referred to as hidden bits. The size of the partial significand field (128) depends on both the size of the BID encoding and the leading bit(s) of the true significand. For example, in BID64, if the true significand has a leading bit of "0", the partial significand field (128) is 53 bits in size. However, if the true significand has the leading bit sequence "100," the partial significand field (128) is 51 bits in size.

FIG. 1 also shows a DPD encoding (102) in accordance with one or more embodiments of the invention. The DPD encoding (102) may be 32 bits (i.e., DPD32), 64 bits (i.e., DPD64), 128 bits (i.e., DPD128), 256 bits (i.e., DPD256), etc. in size. As shown in FIG. 1, the DPD encoding (102) has a sign field (105), a combination field (106), a partial exponent field (107), and a trailing significand field (108). The sign field (105) is a single bit and stores 0 for a positive value or 1 for a negative value. The combination field (106) is five bits and encodes the leading two bits of the biased exponent and the leading digit of the significand. The partial exponent field (107) stores the less significant bits (i.e., all but the two leading bits) of the biased exponent. The size of the partial exponent field (107) depends on the size of the DPD encoding. For example, in DPD64 and DPD 128, the partial exponent field (107) is 8 bits and 12 bits in size, respectively. The trailing significand field (108) encodes the remaining digits (i.e., all but the leading digit) of the significand using DPD encoding. Specifically, the trailing significand field (108) includes groups of 10-bit declets. Each declet encodes three decimal digits using DPD encoding. The size of the trailing significand field (108) depends on the size of the DPD encoding. For example, in DPD64 and DPD128, the trailing significand field (108) is 50 bits and 110 bits in size, respectively.

If the leading two bits of the combination field (106) are "00", "01", or "10", then those are the leading bits of the biased exponent, and the three remaining bits in the combination field (106) are interpreted as the leading decimal digit (0 to 7) in the significand. If the leading 4 bits of the combination field (106) are "1100", "1101", or "1110", then the third and fourth bit of the combination field (106) are the two leading bits of the biased exponent, and the final bit of the combination field (106) is prefixed with "100" to form the leading decimal digit (8 or 9) in the significand. The remaining two combinations (i.e., "11110" and "11111") of the combination field (106) are used to represent ±infinity and "not a number" (i.e., NaNs), respectively.

Figure 2:
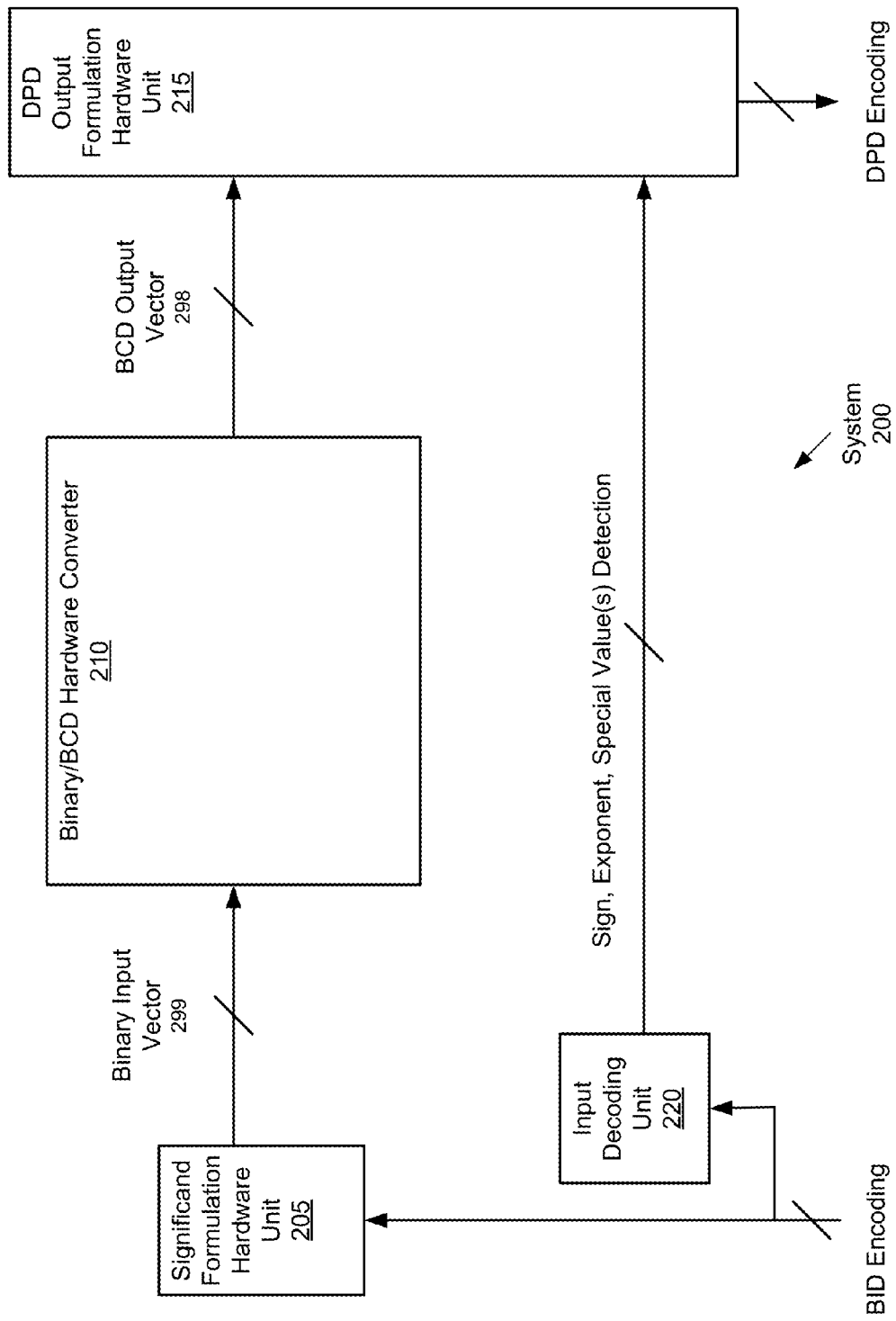
FIG. 2 shows a block diagram depicting a system in accordance in with one or more embodiments of the invention.

FIG. 2 shows a system (200) in accordance with one or more embodiments of the invention. The system (200) converts a BID encoding into a DPD encoding. As shown in FIG. 2, the system has multiple hardware components including: a significand formulation hardware unit (SFHU) (205), an input decoding unit (220), a binary/BCD hardware converter (210), and a DPD output formulation hardware unit (215). One or more of the hardware components (205, 210, 215, 220) may be embedded within one or more general purpose processor cores, field programmable gate arrays (FPGAs), and/or application specific integrated circuits (ASICs).

In one or more embodiments of the invention, the system (200) includes the SFHU (205) and the input decoding unit (220). As shown in FIG. 2, the SFHU (205) and the input decoding unit (220) input a BID encoding (discussed above) of a decimal floating point number. The input decoding unit (220) may include one or more logic units (i.e., circuits) to: (i) extract the sign of the decimal floating point number from the BID encoding; (ii) extract the exponent of the decimal floating point number based on the combination field and the partial exponent field of the BID encoding; and (iii) detect special values (e.g., NaN, +/− infinity, etc.). The SFHU (205) may include one or more logic units (i.e., circuits) to: (i) select one or more hidden bits (i.e., "0" or "100") based on the combination field in the BID encoding; and (ii) generate a binary input vector (299) by concatenating the one or more hidden bits with the partial significand field of the BID encoding. As shown in FIG. 2, the SFHU (205) outputs the binary input vector (299) to the binary/BCD hardware converter (210). As also shown in FIG. 2, the input decoding unit (220) outputs the sign, the exponent, and/or detect special values to the DPD output formulation hardware unit (215).

In one or more embodiments of the invention, the system (200) includes the binary/BCD hardware converter (210). As shown in FIG. 2, the binary/BCD hardware converter (210) inputs the binary input vector (299). The binary/BCD hardware converter (210) may include one or more logic units (i.e., circuits) (discussed below) to: (i) generate multiple BCD vectors based on the binary input vector (299) (discussed below); and (ii) calculate a BCD output vector (298) based on the multiple BCD vectors (also discussed below). In one or more embodiments of the invention, the binary/BCD hardware converter (210) uses E4 and/or E6 decoding blocks/trees and optionally multiplexers, multipliers, and BCD adder tree(s) to generate the BCD output vector (298) from the binary input vector (299) (discussed below). In one or more embodiments of the invention, the binary/BCD hardware converter (210) uses storage elements, multiplexers, and BCD adder tree(s) to generate the BCD output vector (298) from the binary input vector (299) (discussed below).

In one or more embodiments of the invention, the system (200) includes the DPD output formulation hardware unit (215). As shown in FIG. 2, the DPD output formulation hardware unit (215) inputs the BCD output vector (298); the sign; the exponent; and/or the detected special value. The DPD output formulation hardware unit (215) may include one or more logic units (i.e., circuits) to generate a DPD encoding of the decimal floating point number from the sign, the biased exponent, and the BCD output vector (298). As also shown in FIG. 2, the DPD output formulation hardware unit (215) outputs the DPD encoding.

In one or more embodiments of the invention, the system (200) includes solely the binary/BCD hardware converter (210). In other words, in such embodiments, the SFHU (205), the input decoding unit (220), and the DPD output formulation hardware unit (215) are omitted. Moreover, the binary/BCD hardware converter (210) may input the binary input vector (299) from any source, and output the corresponding BCD output vector (298) to any sink.

Figure 3A:
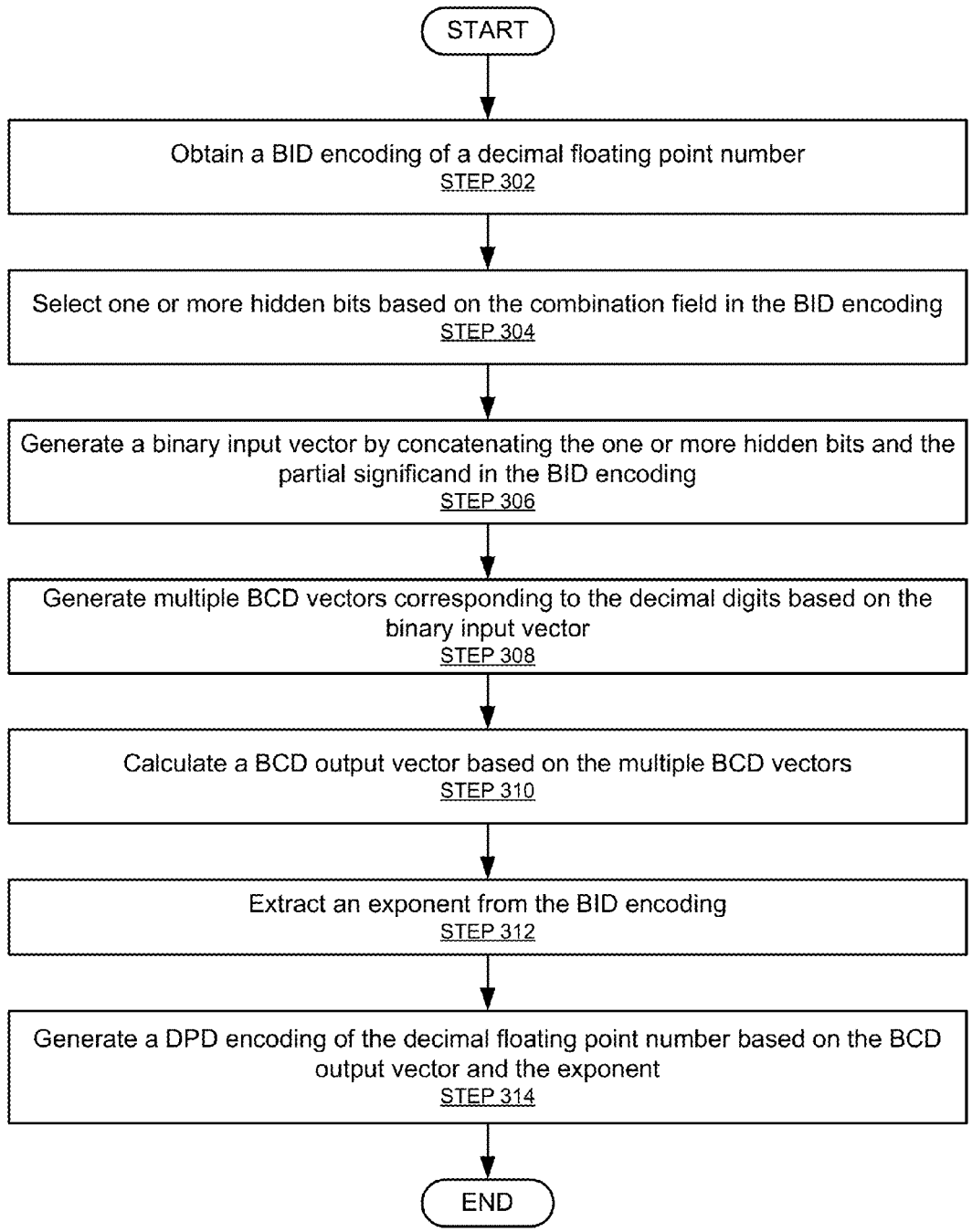
FIG. 3A and FIG. 3B show flowcharts in accordance with one or more embodiments of the invention.

FIG. 3A shows a flowchart in accordance with one or more embodiments of the invention. The process shown in FIG. 3A may be used, for example, with the components of system (200) (e.g., SFHU (205), Binary/BCD Hardware Converter (210), DPD Output Formulation Hardware Unit (215), Input Decoding Unit (220), discussed above in reference to FIG. 2) to convert a BID encoding into a DPD encoding. One or more steps shown in FIG. 3A may be omitted, repeated, and/or performed in a different order among different embodiments of the invention. Accordingly, embodiments of the invention should not be considered limited to the specific number and arrangement of steps shown in FIG. 3A.

Initially, a BID encoding of a decimal floating point number is obtained (STEP 302). As discussed above, the BID encoding includes a sign field, a combination field, a partial exponent field, and a partial significand field. The BID encoding may be of any size including 32 bits, 64 bits, 128 bits, 256 bits, etc.

In STEP 304, one or more hidden bits are selected/identified based on the combination field in the BID encoding. Specifically, when the most significant two bits of the combination field are not "11", the hidden bit is "0". However, when the first two bits of the combination field are "11", the hidden bits are "100".

In STEP 306, a binary input vector is generated. Specifically, the binary input vector is generated by concatenating the one or more hidden bits with the bits in the partial significand field of the BID encoding.

In STEP 308, multiple BCD vectors corresponding to the decimal digits in the decimal floating point number are generated. The BCD vectors may be generated from E4 and/or E6 decoding blocks/trees, multiplexers, and multipliers (discussed below). In STEP 310, a BCD output vector is calculated from the multiple BCD vectors. Specifically, the BCD output vector may be calculated by summing one or more of the BCD vectors using BCD adder trees (discussed below).

In STEP 312, a biased exponent is extracted from combination field and the partial exponent field of the BID encoding. In one or more embodiments of the invention, if the two bits immediately following the sign field in the BID encoding are "00", "01", or "10", then the combination field is only two bits in size, and the bits of the biased exponent correspond to the concatenation of the combination field and the partial exponent field. In one or more embodiments of the invention, if the two bits immediately following the sign field in the BID encoding are "11", the combination field is four bits in size, and the bits of the biased exponent correspond to the concatenation of the least significant two bits of the combination field with the bits in the partial exponent field.

In STEP 314, a DPD encoding of the decimal floating point number is generated based on the BCD output vector, the sign, and the extracted exponent. In BCD encoding (e.g., the BCD output vector), each decimal digit is encoded using 4 bits. In contrast, in DPD encoding, a set of three decimal digits are encoded using a 10-bit declet. Accordingly, generating the DPD encoding will include converting from the 4 bits/digit representation of BCD encoding to the declet representation of DPD encoding As discussed above, the system (200) may include solely the binary/BCD hardware converter (210). In other words, in such embodiments, the SFHU (205), the input decoding unit (220), and the DPD output formulation hardware unit (215) are omitted. Moreover, the binary/BCD hardware converter (210) may input a binary input vector (299) from any source, and output the corresponding BCD output vector (298) to any sink.

Figure 3B:
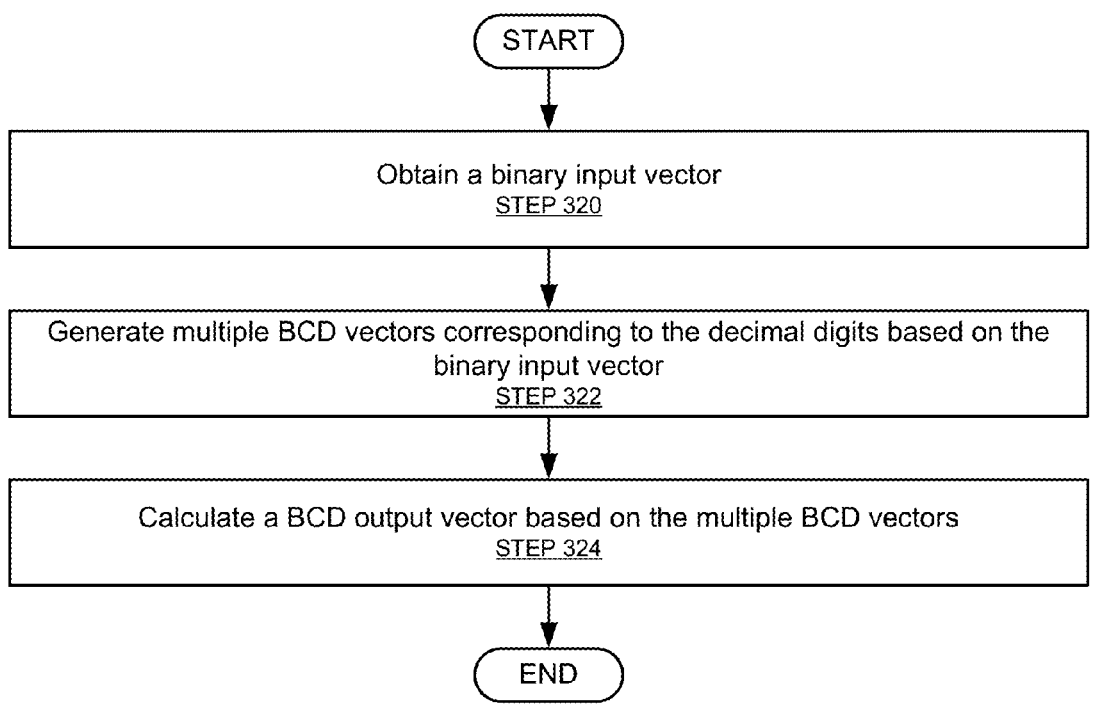

FIG. 3B shows a flowchart in accordance with one or more embodiments of the invention. The process shown in FIG. 3B may be used, for example, with the binary/BCD Hardware Converter (210), discussed above in reference to FIG. 2, to convert a binary input vector into a BCD output vector. One or more steps shown in FIG. 3B may be omitted, repeated, and/or performed in a different order among different embodiments of the invention. Accordingly, embodiments of the invention should not be considered limited to the specific number and arrangement of steps shown in FIG. 3B.

Initially, a binary input vector is obtained (STEP 320). The binary input vector may be obtained from any source and may be of any size.

In STEP 322, multiple BCD vectors are generated based on the binary input vector. The multiple BCD vectors may be generated from E4 and/or E6 decoding blocks/trees, multiplexers, and multipliers (discussed below).

In STEP 324, a BCD output vector is calculated from the multiple BCD vectors. Specifically, the BCD output vector may be calculated by summing one or more of the BCD vectors using BCD adder trees (discussed below). The BCD output vector may be sent to any sink.

As discussed above, the BID encoding may be of any size, including 32 bits (i.e., BID32), 64 bits (i.e., BID64), 128 bits (i.e., BID128), 256 bits (i.e., BID256), etc. Those skilled in the art, having the benefit of this detailed description, will appreciate that if the BID encoding is BID64, the binary input vector will be 54 bits. Similarly, if the BID encoding is BID128, the binary input vector will be 114 bits.

Static Binary/BCD Conversion

In one or more embodiments of the invention, binary input is converted to BCD by a static binary/BCD conversion technique. The static binary/BCD conversion technique consists of examining the three most significant bits of the binary number. If the value of the three bits is greater than or equal to five, add binary three to the number and shift the result one bit to the left. If the value of the three bits is less than five, shift one bit to the left without adding three. Take the next bit from the right and repeat the operation until reaching the least significant bit, which will be carried over without decoding. In one or more embodiments of the invention, the static binary/BCD conversion technique is implemented by combinational logic. In one or more embodiments of the invention, the static binary/BCD conversion technique is implemented by cascading multiple look-up table elements.

Figure 4A:
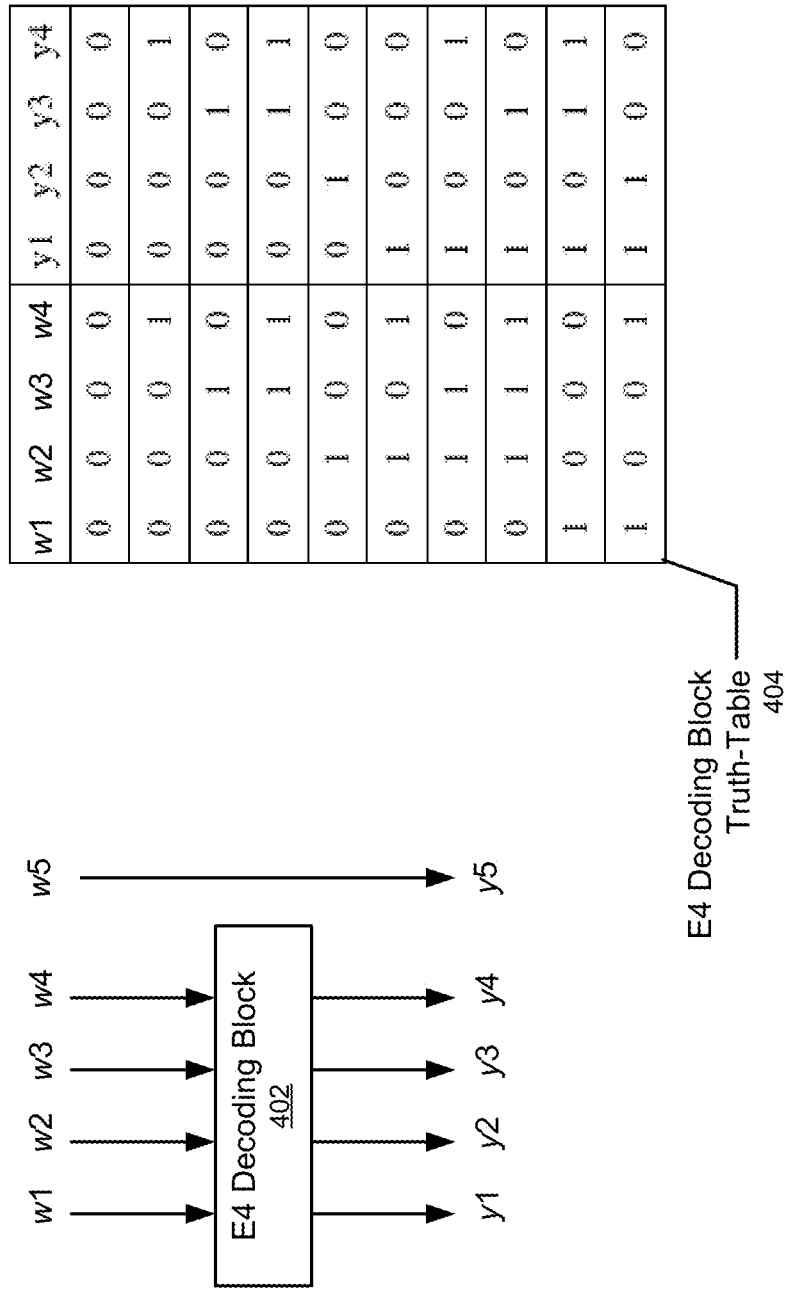
FIG. 4A shows an E4 decoding block and its truth-table in accordance with one or more embodiments of the invention.

FIG. 4A shows an E4 decoding block (402) in accordance with one or more embodiments of the invention. The E4 decoding block (402) is used to implement the static binary/BCD conversion technique. As shown in FIG. 4A, the E4 decoding block (402) has four input bits (w1, w2, w3, w4) and four output bits (y1, y2, y3, y4). The E4 decoding block (402) is effectively a look-up table with the relationship between the four input bits and the four output bits provided by truth-table (404).

Figure 4B:
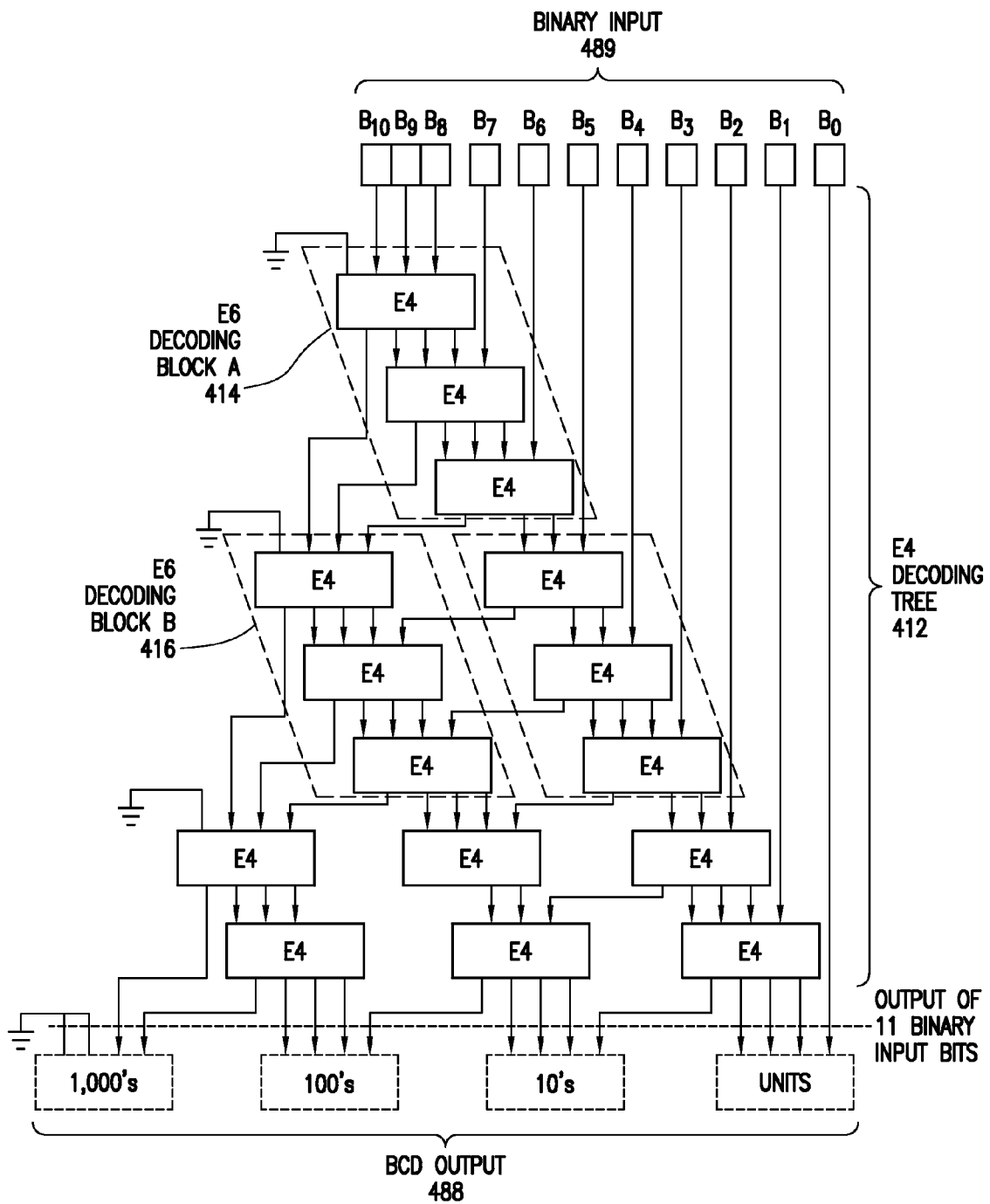
FIG. 4B shows an E4 decoding tree in accordance with one or more embodiments of the invention.

FIG. 4B shows an E4 decoding tree (412) in accordance with one or more embodiments of the invention. The E4 decoding tree (412) implements the static binary/BCD conversion technique. As shown in FIG. 4B, the E4 decoding tree (412) includes multiple stages of E4 decoding blocks (i.e., E4 decoding block (402), discussed above in reference to FIG. 4A). As also shown in FIG. 4B, the E4 decoding tree (412) inputs the binary input (489) having multiple binary bits (i.e., $B_{10}, B_9, B_8, \ldots, B_1, B_0$) and outputs the corresponding BCD representation (i.e., BCD output (488)). Although the E4 decoding tree (412) in FIG. 4B can only handle a maximum input of 11 binary bits, E4 decoding trees to handle any size of binary input may be built. The number of E4 decoding blocks increases rapidly with the number of binary bits to be converted to BCD. The number of E4 decoding stages in an E4 decoding tree=Number of Input bits−3.

In one or more embodiments of the invention, an E6 decoding block (e.g., E6 Decoding Block A (414), E6 Decoding Block B (416)) is formed from merging three E4 decoding blocks. The E6 decoding block is a higher level decoder than the E4 decoding block and may be used to implement the static binary/BCD conversion technique. As shown in FIG. 4B, each E6 decoding block (414, 416) has 6 inputs and 6 outputs.

FIG. 4C shows the E6 decoding block truth-table (420) for each E6 decoding block. As the three least significant output bits have only 5 out of 8 combinations (i.e., octal 0=binary 000; octal 1=binary 001; octal 2=010; octal 3=binary 011; and octal 4=binary 100), these three bits will be connected to the three most significant input bits of another E6 decoding unit. The three least input bits have all possible values (8 numbers) so the total number of words stored in each E6 decoding block is 5×8=40 words (denoted by line numbers 0-39 of the truth-table (420) in FIG. 4C).

Figure 4D:
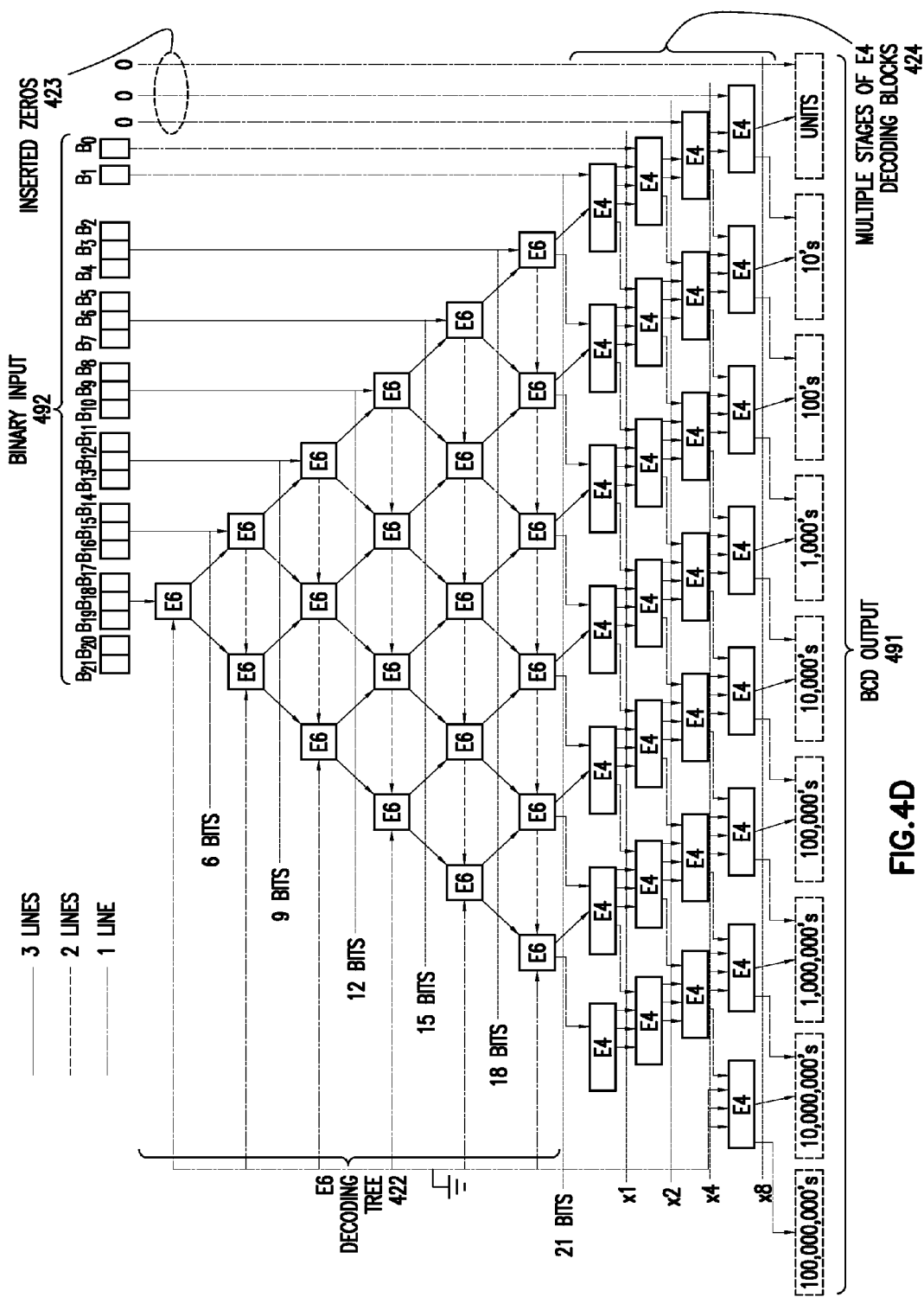
FIG. 4D shows an E6 decoding tree operatively connected to multiple stages of E4 decoding blocks in accordance with one or more embodiments of the invention.

FIG. 4D shows an E6 decoding tree (422) operatively connected to multiple stages of E4 decoding blocks (424) in accordance with one or more embodiments of the invention. The E6 decoding tree (422) and multiple stages of E4 decoding blocks (424) implement the static binary/BCD conversion technique. As shown in FIG. 4D, the binary input (492) has 22 bits (i.e., $B_{21}, B_{20}, \ldots, B_1, B_0$) and is concatenated with three inserted zeros (423). This effectively multiplies the binary input (492) by 2^3=8. This concatenated value is the input to the E6 Decoding Tree (422) and multiple stages of E4 decoding blocks (424).

Still referring to FIG. 4D, assume the binary input (492) has a corresponding BCD value. The final stage of E4 decoding blocks outputs a BCD output (491), which is an eight multiple of the BCD value. In other words, BCD Output (491)=8×BCD value of Binary Input (492). The second last stage of E4 decoding blocks outputs a four multiple of the BCD value (i.e., 4×BCD value of Binary Input (492)). The third last stage of E4 decoding blocks outputs a 2 multiple of the BCD value (i.e., 2×BCD value of Binary Input (492)). The fourth last stage of E4 decoding blocks outputs the BCD value itself (i.e., 1×BCD value of Binary Input (492)). In other words, each stage of the multiple stages of E4 decoding blocks (424) outputs a different multiple (×1, ×2, ×4, ×8) of the BCD value of binary input (492). Although the binary input (492) has a cardinality of 21 bits, those skilled in the art, having the benefit of this detailed description, will appreciate that the E6 decoding tree (422) and multiple stages of E4 decoding blocks (424) may be expanded/scaled to accommodate a binary input of any size.

BIN2BCD Master Module Embodiments

Figure 5A:
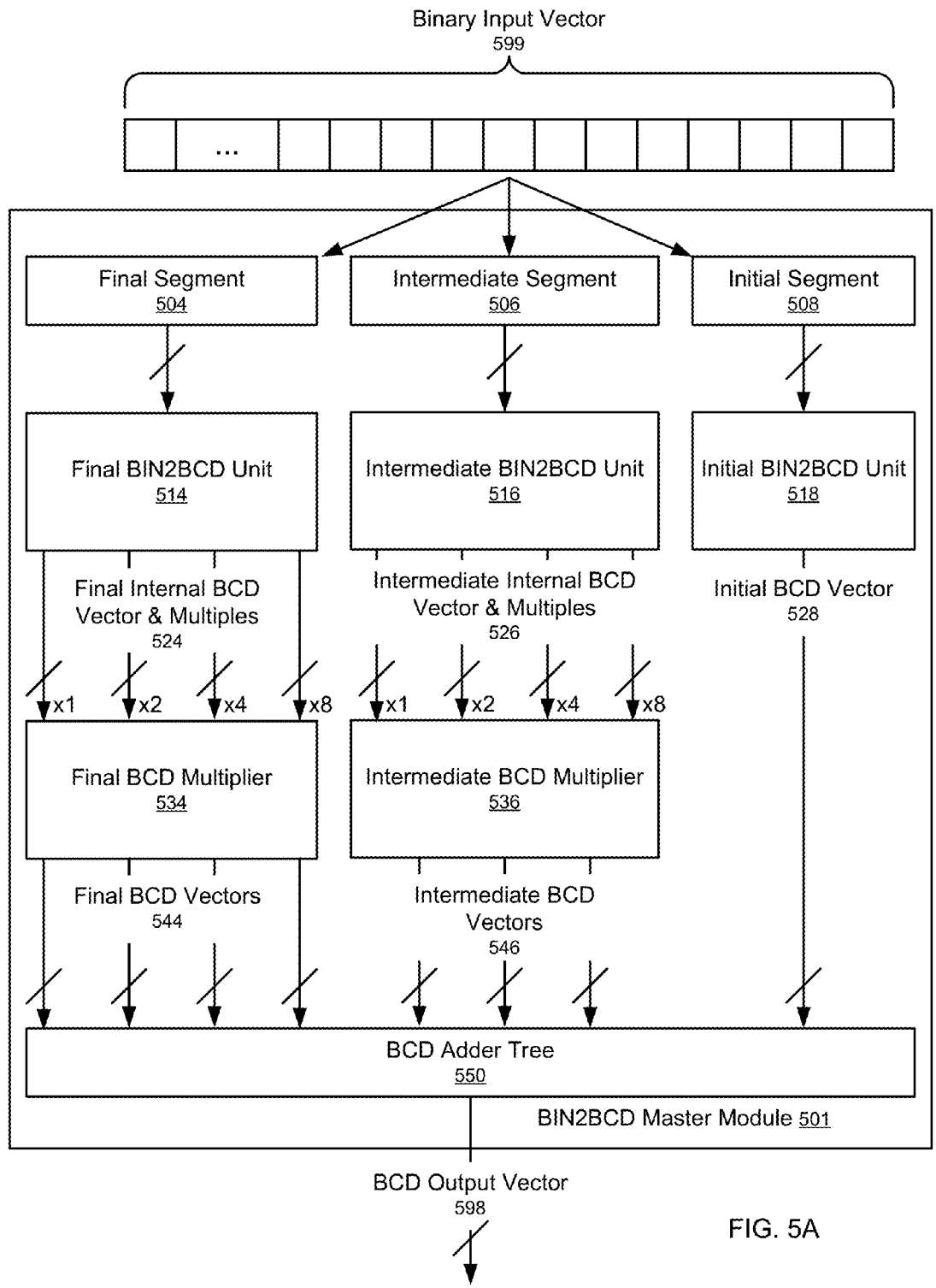
FIG. 5A shows a BIN2BCD master module in accordance with one or more embodiments of the invention.

FIG. 5A shows a BIN2BCD master module (501) in accordance with one or more embodiments of the invention. The BIN2BCD master module (501) may be a component (i.e., circuit) of the binary/BCD hardware converter (210), discussed above in reference to FIG. 2. The BIN2BCD master module (501) has multiple components including a final BIN2BCD unit (514), an intermediate BIN2BCD unit (516), an initial BIN2BCD unit (518), a final BCD multiplier (534), an intermediate BCD multiplier (536), and a BCD adder tree (550). As shown in FIG. 5A, the BIN2BCD master module (501) inputs a binary input vector (599) and outputs a BCD output vector (598). The binary input vector (599) and the BCD output vector (598) correspond to the binary input vector (299) and BCD output vector (298), respectively, discussed above in reference to FIG. 2.

In one or more embodiments of the invention, the BIN2BCD master module (501) partitions the binary input vector (599) into multiple non-overlapping segments: an initial segment (508), a final segment (504), and one or more intermediate segments (e.g., intermediate segment (506)). In one or more embodiment of the invention, the binary input vector (599) is 54 bits in size, the initial segment (508) is 11 bits in size, the intermediate segment (506) is 20 bits in size, and the final segment (504) is 23 bits in size. Each segment (504, 506, 508) is the input to a corresponding BIN2BCD unit (514, 516, 518). For example, the final segment (504) is the input to the final BIN2BCD unit (514), the intermediate segment (506) is the input to the intermediate BIN2BCD unit (516), and the initial segment (508) is the input to the initial BIN2BCD unit (518).

In one or more embodiments of the invention, each of the BIN2BCD units (514, 516, 518) generates/outputs an internal BCD vector. Some BIN2BCD units (514, 516) also output multiples of the internal BCD vector. For example, the initial BIN2BCD unit (518) outputs the initial BCD vector (528). The initial BCD vector (528) is a BCD representation of the binary initial segment (508). Further, the intermediate BIN2BCD unit (516) outputs the intermediate internal BCD vector and one or more multiples of the intermediate internal BCD vector (526) (e.g., 2× intermediate internal BCD vector, 4× intermediate internal BCD vector, etc.). The intermediate internal BCD vector is a BCD representation of the binary intermediate segment (506). Further still, the final BIN2BCD unit (514) outputs the final internal BCD vector and one or more multiples of the final internal BCD vector (524) (e.g., 2× final internal BCD vector, 4× final internal BCD vector, 8× final internal BCD vector). The final internal BCD vector is a BCD representation of the binary final segment (504).

In one or more embodiments of the invention, each of the BIN2BCD units (514, 516, 518) comprise an E6 decoding tree operatively connected to one or more stages of E4 decoding blocks to generate the BCD vector and its multiples (524, 526, 528). In other words, each of the BIN2BCD units (514, 516, 518) comprises circuits similar to the circuit shown in FIG. 4D, but with different numbers of E6 and/or E4 decoding blocks.

In one or more embodiments of the invention, the BIN2BCD master module (501) includes a final BCD multiplier (534) and an intermediate BCD multiplier (536). The final BCD multiplier (534) inputs the final internal BCD vector and the multiplies (i.e., ×2, ×4, ×8) of the final internal BCD vector (524) generated by the final BIN2BCD unit (514). Similarly, the intermediate BCD multiplier (536) inputs the intermediate internal BCD vector and the multiples (i.e., ×2, ×4, ×8) of the intermediate internal BCD vector (526) generated by the intermediate BIN2BCD unit (516). Both the final BCD multiplier (534) and the intermediate BCD multiplier (536) have multiplexers and shifting circuits (not shown). As shown in FIG. 5A, the final BCD multiplier (534) and the intermediate BCD multiplier (536) output the final BCD vectors (544) and the intermediate BCD vectors (546), respectively.

In one or more embodiments of the invention, the intermediate BCD multiplier (536) generates partial products corresponding to the multiplication of the intermediate internal BCD vector by a constant. The constant is based on a least significant bit of the intermediate segment (506). In one or more embodiments of the invention, the constant is $2^W$, where W is the location of the least significant bit of the intermediate segment (506) in the binary input vector (599). For example, if the binary input vector (599) is 54 bits in size, the initial segment (508) is 11 bits in size, and the intermediate segment (506) is 20 bits in size, W=11, and $2^W$=2048. Accordingly, in the example, the intermediate BCD multiplier (536) generates partial products corresponding to: the intermediate internal BCD vector×2048.

In one or more embodiments of the invention, the intermediate BCD multiplier (536) generates the partial products using the input intermediate internal BCD vector and its multiples (526). For example, assume the constant is 2048. The multiplication may be expressed as three partial products: intermediate internal BCD vector×(2000+40+8)=[intermediate internal BCD vector×2]×1000+[intermediate internal BCD vector×4]×10+[intermediate internal BCD vector× 8]. Each partial product corresponds to an available multiple of the intermediate internal BCD vector generated by the intermediate BIN2BCD unit (516). Any multiplication by 10, 100, 1000, 10 000, etc. is accomplished by shifting (i.e., using the shifting circuits of the intermediate BCD multiplier (536)) the intermediate internal BCD vector and/or its multiples (i.e., shifting a BCD value left by 4 bits=BCD vector×10). The intermediate BCD vectors (546) correspond to the partial products generated by the intermediate BCD multiplier (536).

In one or more embodiments of the invention, the final BCD multiplier (534) generates partial products corresponding to the multiplication of the final internal BCD vector by a constant. The constant is based on a least significant bit of the final segment (504). In one or more embodiments of the invention, the constant is $2^W$, where W is the location of the least significant bit of the final segment (504) in the binary input vector (599). For example, if the binary input vector (599) is 54 bits in size, the initial segment (508) is 11 bits in size, and the intermediate segment (506) is 20 bits in size, W=31, and 2^W=2,147,483,648. Accordingly, in the example, the final BCD multiplier (534) generates partial products corresponding to: the final internal BCD vector×2, 147,483,648.

In one or more embodiments of the invention, the final BCD multiplier (534) generates the partial products using the input final internal BCD vector and its multiples (524). Each partial product corresponds to an available multiple of the final internal BCD vector generated by the final BIN2BCD unit (514). Any multiplication by 10, 100, 1000, 10 000, etc. is accomplished by shifting (i.e., using the shifting circuits of the final BCD multiplier (534)) the final BCD value and/or its multiples. The final BCD vectors (544) correspond to the partial products generated by the final BCD multiplier (534).

In one or more embodiments of the invention, the BIN2BCD master module (501) includes the BCD adder tree (550). The BCD adder tree (550) calculates the BCD output vector (598) by summing the final BCD vectors (544) (i.e., partial products generated by the final BCD multiplier (534)), the intermediate BCD vectors (546) (i.e., the partial products generated by the intermediate BCD multiplier (536)), and the initial BCD vector (528).

Those skilled in the art, having the benefit of this detailed description, will appreciate that by partitioning the binary input vector (599) into multiple binary segments, converting each segment into an internal BCD vector, multiplying each internal BCD vector by the appropriate constant, and then adding the partial products, the resulting sum (i.e., BCD Output Vector (598)) will correspond to the BCD representation of the binary input vector (599). Moreover, those skilled in the art, having the benefit of this detailed description, will appreciate that the binary input vector (599) may be portioned into any number of binary segments (e.g., 2 binary segments, 5 binary segments, 8 binary segments, etc.).

Figure 5B:
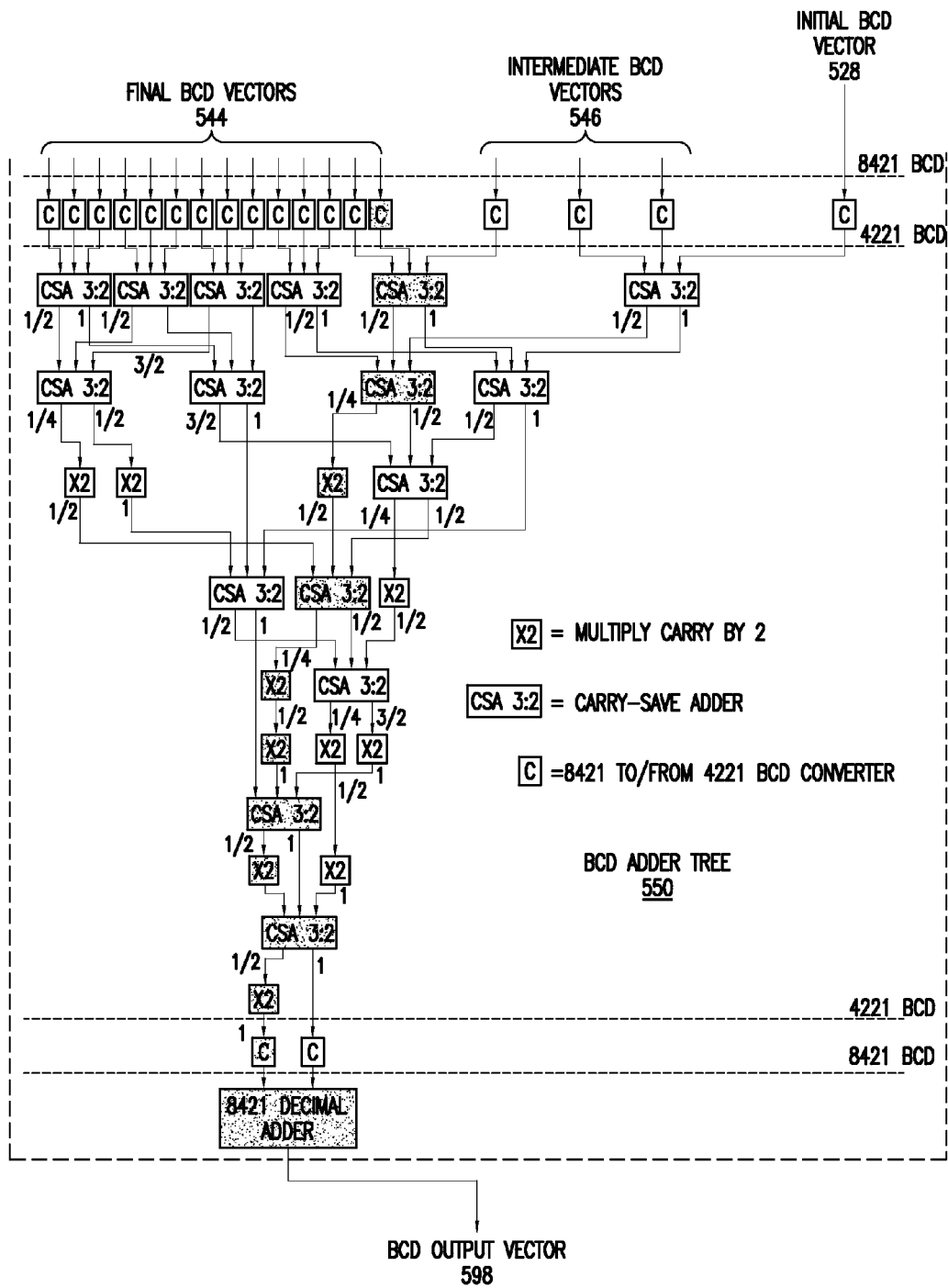
FIG. 5B shows a BCD adder tree in accordance with one or more embodiments of the invention.

FIG. 5B shows the BCD adder tree (550) in accordance with one or more embodiments of the invention. As shown in FIG. 5B, the final BCD vectors (544), the intermediate BCD vectors (546), and the initial BCD vector (528) are inputs to the BCD adder tree (550), while the BCD output vector (598) is the output of the BCD adder tree (550). As also shown in FIG. 5B, the BCD adder tree (550) includes multiple stages of 3:2 carry-save adders, 8421 to/from 4221 converters, and/or multiply carry by 2, and the BCD output vector (598) is generated by a decimal adder.

Figure 6A:
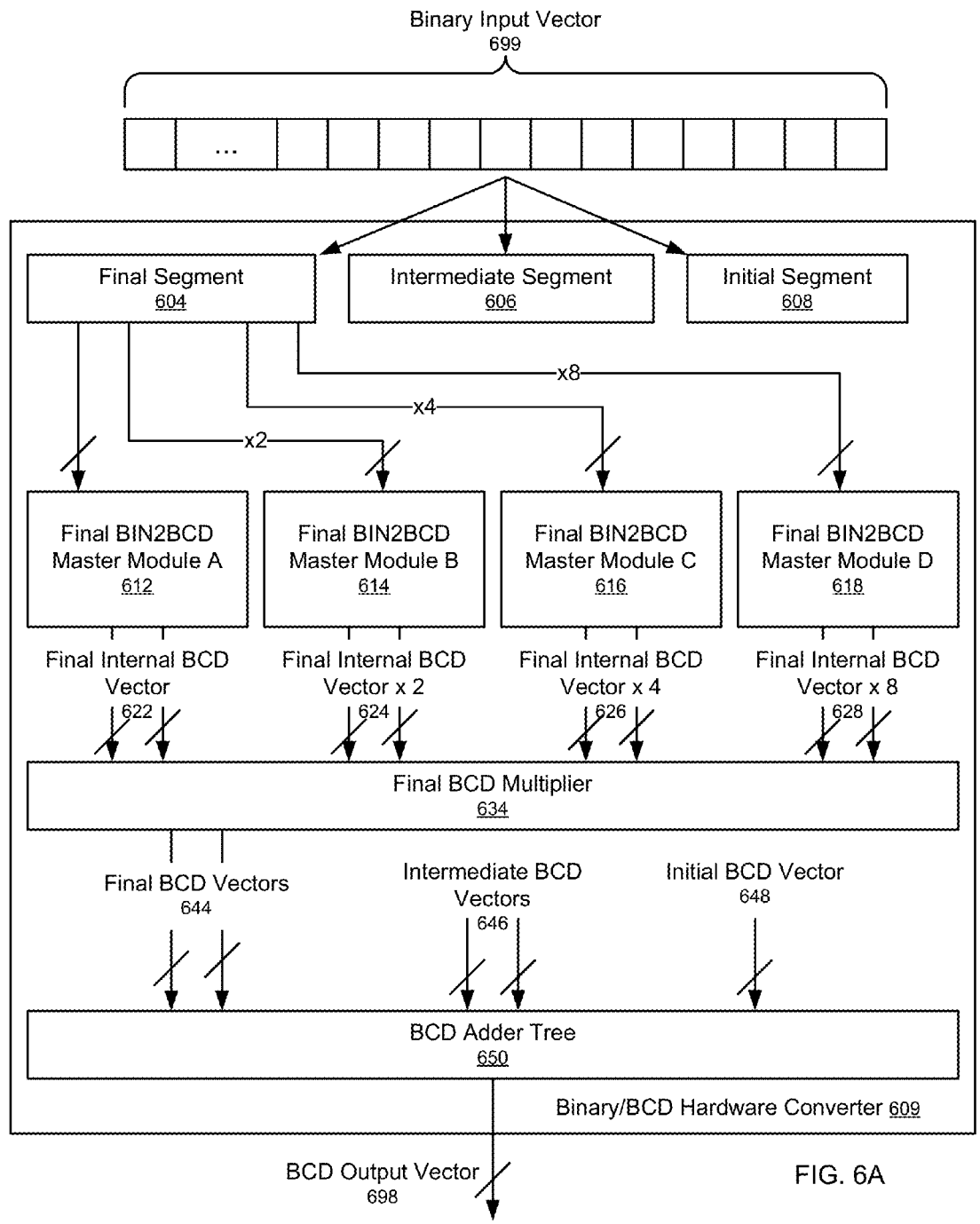
FIGS. 6A, 6B, and 6C show binary/BCD hardware converters in accordance with one or more embodiments of the invention.

FIG. 6A shows a binary/BCD hardware converter (609) in accordance with one or more embodiments of the invention. As shown in FIG. 6A, the binary/BCD hardware converter (609) has multiple components including: final BIN2BCD master module A (612), final BIN2BCD master module B (614), final BIN2BCD master module C (616), final BIN2BCD master module D (618), a final BCD multiplier (634), and a BCD adder tree (650). As also shown in FIG. 6A, the binary/BCD hardware converter (609) inputs binary input vector (699) and outputs BCD output vector (698). The binary input vector (699), the binary/BCD hardware converter (609), and the BCD output vector (698) may correspond to the binary input vector (299), the hardware converter (210), and the BCD output vector (298), respectively, discussed above in reference to FIG. 2.

In one or more embodiments of the invention, the binary/BCD hardware converter (609) partitions the binary input vector (699) into an initial segment (608), a final segment (604), and one or more intermediate segments (e.g., intermediate segment (606)). In one or more embodiment of the invention, the binary input vector (699) is 114 bits in size, the initial segment (608) is 12 bits in size, the intermediate segment (606) is 51 bits in size, and the final segment (604) is also 51 bits in size.

As shown in FIG. 6A, the final segment (604) is the input to final BIN2BCD master module A (612). Further, a two multiple of the final segment (i.e., 2× the final segment (604)) is the input to final BIN2BCD master module B (614). Further, a four multiple of the final segment (i.e., 4× the final segment (604)) is the input to final BIN2BCD master module C (616). Further still, an eight multiple of the final segment (i.e., 8× the final segment (604)) is the input to final BIN2BCD master module D (618). Those skilled in the art, having the benefit of this detailed description, will appreciate that: (i) 2× the final segment (604) corresponds to a single shifted version of the final segment (604); (ii) 4× the final segment (604) corresponds to a double shifted version of the final segment (604); and (iii) 8× the final segment (604) corresponds to a triple shifted version of the final segment (604).

In one or more embodiments of the invention, each final BIN2BCD master module (612, 614, 616, 618) is similar to the BIN2BCD master module (501), discussed above in reference to FIG. 5A. In fact, the only difference between each final BIN2BCD master module (612, 614, 616, 618) and the BIN2BCD master module (501) is the number of output ports. In the BIN2BCD master module (501), the final stage of the BCD adder tree (550) has a decimal adder that generates a single BCD output vector (598). Accordingly, the BIN2BCD master module (501) has a single output port for the single BCD output vector (598). In contrast, the last stage of each final BIN2BCD master module (612, 614, 616, 618) does not have a decimal adder due to a delay reduction. As a result, each final BIN2BCD master module (612, 614, 616, 618) has two output ports corresponding to the two vectors that would have been the inputs to the decimal adder (if the decimal adder existed). Moreover, each final BIN2BCD master module (612, 614, 616, 618) generates a BCD representation, in carry-save format, of its input. For example, final BIN2BCD master module A (612) outputs internal BCD vector (622), which is a BCD representation of the final segment (604). Further, final BIN2BCD master module B (614) outputs 2× the internal BCD vector (624), which is a BCD representation of the single shifted version of the final segment (604). Further, final BIN2BCD master module C (616) outputs 4× internal BCD vector (626), which is a BCD representation of the double shifted version of the final segment (604). Further still, final BIN2BCD master module D (618) outputs 8× internal BCD vector (628), which is a BCD representation of the triple shifted version of the final segment (604).

In one or more embodiments of the invention, the binary/BCD hardware converter (609) includes the final BCD multiplier (634). The final BCD multiplier (634) inputs the internal BCD vector (622), 2× the internal BCD vector (624), 4× the internal BCD vector (626), and 8× the internal BCD vector (628) generated by the multiple final BIN2BCD master modules (612, 614, 616, 618). The final BCD multiplier (634) has multiplexers and shifting circuits (not shown). As shown in FIG. 6A, the final BCD multiplier (634) outputs the final BCD vectors (644).

In one or more embodiments of the invention, the final BCD multiplier (634) generates partial products corresponding to the multiplication of the internal BCD vector (622) by a constant. The constant is based on a least significant bit of the final segment (604). In one or more embodiments of the invention, the constant is 2^W, where W is the location of the least significant bit of the final segment (604) in the binary input vector (699). For example, if the binary input vector (699) is 114 bits in size, the initial segment (608) is 12 bits in size, and the intermediate segment (606) is 51 bits in size, W=63. Accordingly, in the example, the final BCD multiplier (634) generates partial products corresponding to: the internal BCD vector×2^63. Operation of the final BCD multiplier (634) is essentially the same as the operation of the final BCD multiplier (534) and the intermediate BCD multiplier (536), discussed above in reference to FIG. 5A.

In one or more embodiments of the invention, the final BCD multiplier (634) generates the partial products using the final internal BCD vector and its multiples (622, 624, 626, 628). Each partial product corresponds to an available multiple of the final internal BCD vector generated by the multiple final BIN2BCD master modules (612, 614, 616, 618). Any multiplication by 10, 100, 1000, 10 000, etc. is accomplished by shifting (i.e., using the shifting circuits of the final BCD multiplier (634)) the final internal BCD vector and/or its multiples (622, 624, 626, 628). The final BCD vectors (644) correspond to the partial products generated by the final BCD multiplier (634).

As shown in FIG. 6A, the final BCD vectors (644) are generated from the final segment (604) using multiple final BIN2BCD master modules (612, 614, 616, 618) and the final BCD multiplier (634). The intermediate BCD vectors (646) are generated from the intermediate segment (606) using multiple intermediate BIN2BCD master modules (not shown) and an intermediate BCD multiplier (not shown). The multiple intermediate BIN2BCD master modules and the intermediate BCD multiplier are similar to the multiple final BIN2BCD master modules (612, 614, 616, 618) and the final BCD multiplier (634), respectively. The initial BCD vector (648) is generated from the initial segment (608) using an initial BIN2BCD unit (not shown). The initial BIN2BCD unit is essentially the same as the initial BIN2BCD unit (518), discussed above in reference to FIG. 5A.

In one or more embodiments of the invention, the BCD adder tree (650) generates the BCD output vector (698) by summing the final BCD vectors (644), the intermediate BCD vectors (646), and the initial BCD vector (648). The BCD adder tree (650) may include 41 BCD8421 inputs and one BCD8421 output vector. The first stage has parallel 8421 to 4221 coder modules which converts 41 BCD8421 vectors to 41 BCD4221 vectors and the last stage has the reverse operation which converts the final 2 vectors from BCD4221 to BCD 8421. In between, there is a BCD tree of 3:2 compressors and multiply carry by 2 modules.

Figure 6B:
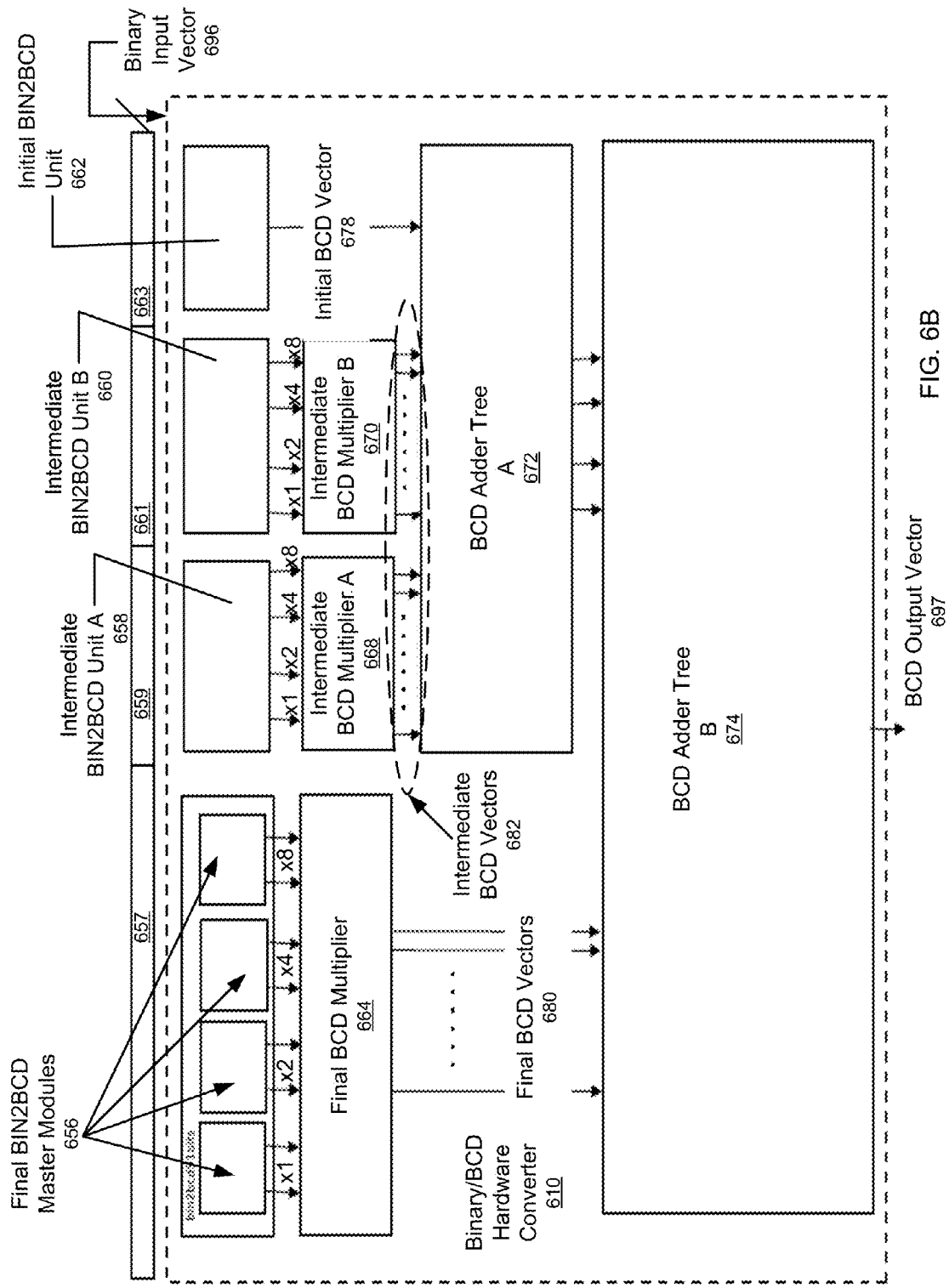

FIG. 6B shows a binary/BCD hardware converter (610) in accordance with one or more embodiments of the invention. As shown in FIG. 6B, the binary/BCD hardware converter (610) has multiple components including multiple final BIN2BCD master modules (656), multiple intermediate BIN2BCD units (i.e., Intermediate BIN2BCD Unit A (658), Intermediate BIN2BCD Unit B (660)), an initial BIN2BCD unit (662), a final BCD multiplier (664), multiple intermediate BCD multipliers (i.e., Intermediate BCD Multiplier A (668), Intermediate BCD Multiplier B (670)), and multiple BCD adder trees (i.e., BCD Adder Tree A (672), BCD Adder Tree B (674)). As also shown in FIG. 6B, the binary/BCD hardware converter (610) inputs a binary input vector (696) and outputs the BCD output vector (697). The binary input vector (696), the binary/BCD hardware converter (610), and the BCD output vector (697) may correspond to the binary input vector (299), the binary/BCD hardware converter (210), and the BCD output vector (298), discussed above in reference to FIG. 2. In other words, the BCD output vector (697) is a BCD representation of the binary input vector (696).

In one or more embodiments of the invention, the binary/BCD hardware converter (610) partitions the binary input vector (696) into an initial segment (663), two intermediate segments (659, 661), and a final segment (657). The binary input vector (696) is 114 bits in size, the initial segment (663) is 19 bits in size, both intermediate segments (659, 661) are 22 bits in size, and the final segment (657) is 51 bits in size.

In one or more embodiments of the invention, the final segment (657), a single shifted version of the final segment (i.e., 2× final segment), a double shifted version of the final segment (i.e., 4× final segment), and a triple shifted version of the final segment (i.e., 8× final segment) are the input to multiple final BIN2BCD master modules (656). The outputs of the multiple final BIN2BCD master modules include a final internal BCD vector (i.e., a BCD representation of the final segment (657)), a two multiple of the final internal BCD vector, a four multiple of the final internal BCD vector, and an eight multiple of the final internal BCD vector. The outputs of the multiple final BIN2BCD master modules (656) are the inputs to the final BCD multiplier (664). Moreover, the final BCD multiplier (664) outputs the final BCD vectors (680). The final BIN2BCD master modules (656), the final BCD multiplier (664), and the final BCD vectors (680) are essentially the same as the final BIN2BCD master modules (612, 614, 616, 618), the final BCD multiplier (634), and the final BCD vectors (644), respectively, discussed above in reference to FIG. 6A.

Still referring to FIG. 6B, the intermediate segments (659, 661) are the inputs to the intermediate BIN2BCD units (658, 660). The intermediate BIN2BCD unit A (658) outputs an intermediate internal BCD vector of the intermediate segment (659). The intermediate BIN2BCD unit A (658) also outputs a two multiple of the intermediate internal BCD vector of the intermediate segment (659), a four multiple of the intermediate internal BCD vector of the intermediate segment (659), and an eight multiple of the intermediate internal BCD vector of the intermediate segment (659). The intermediate BIN2BCD unit B (660) outputs an intermediate internal BCD vector, and its two, four, and eight multiples, of the other intermediate segment (661).

The outputs of the intermediate BIN2BCD units (658, 660) are the inputs to the intermediate BCD multipliers (668, 670). Moreover, the intermediate BCD multipliers (668, 670) output the intermediate BCD vectors (682). Each intermediate BIN2BCD unit (658, 660), each intermediate BCD multiplier (668, 670), and the intermediate BCD vectors (682) are similar to the intermediate BIN2BCD unit (516), the intermediate BCD multiplier (536), and the intermediate BCD vectors (546), respectively, discussed above in reference to FIG. 5A.

Still referring to FIG. 6B, the initial segment (663) is the input to the initial BIN2BCD unit (662). The output of the initial BIN2BCD unit (662) is the initial BCD vector (678) (i.e., a BCD representation of the initial segment). The initial BIN2BCD unit (662) and the initial BCD vector (678) are similar to the initial BIN2BCD unit (518) and the initial BCD vector (528), respectively, discussed above in reference to FIG. 5A.

FIG. 6B has two BCD adder trees: BCD Adder Tree A (672) and BCD Adder Tree B (674). The BCD adder tree A (672) calculates a sum of the intermediate BCD vectors (682) and the initial BCD vector (678). The BCD adder tree B (674) calculates the BCD output vector (697) by adding the sum from the BCD adder tree A (672) with the final BCD vectors (680). In one or more embodiments of the invention, the BCD adder tree A (672) is calculating the sum in parallel with the final BCD multiplier (664) generating the final BCD vectors (680).

Figure 6C:
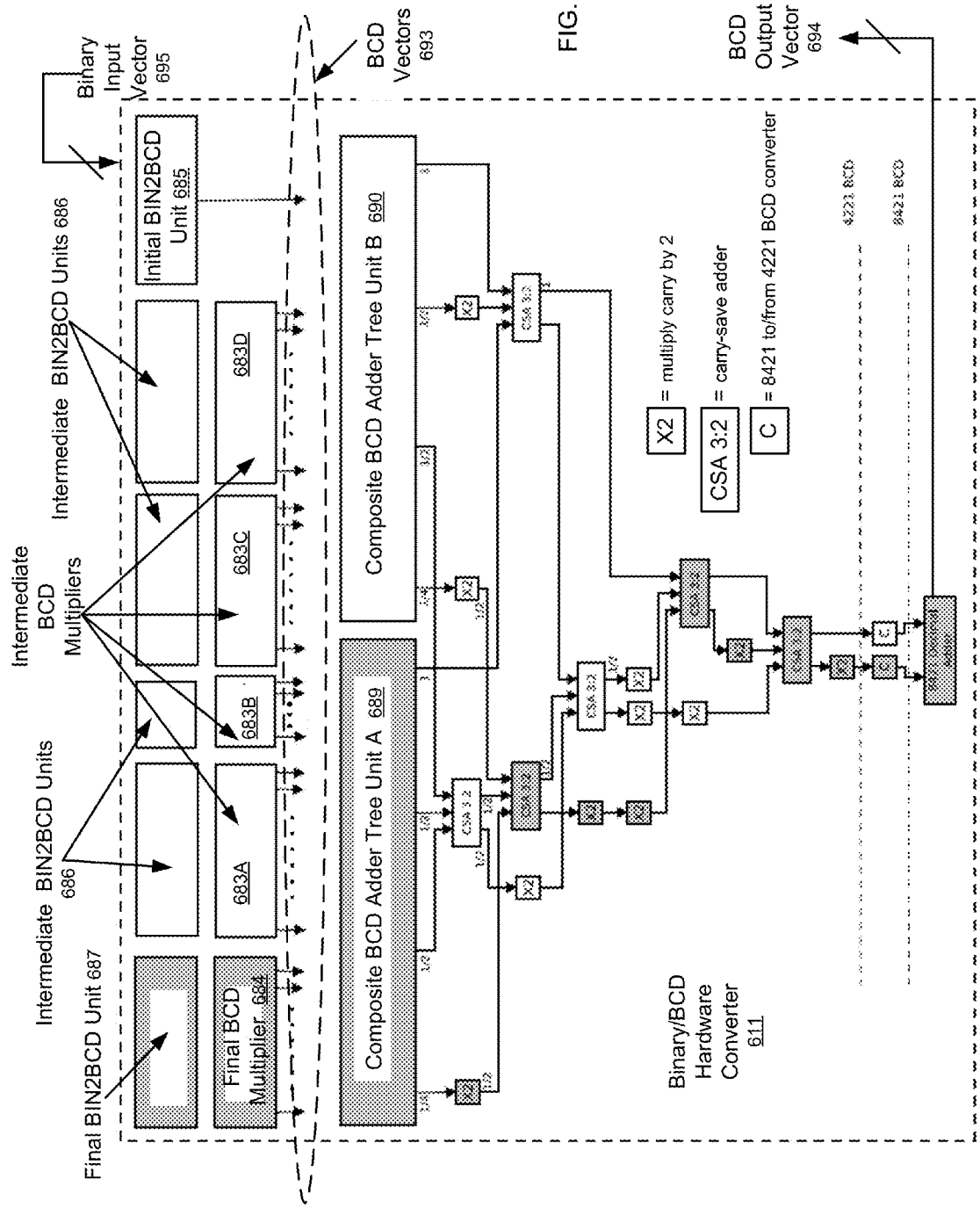

FIG. 6C shows a binary/BCD hardware converter (611) in accordance with one or more embodiments of the invention. As shown in FIG. 6C, the binary/BCD hardware converter (611) has multiple components including a final BIN2BCD unit (687), multiple intermediate BIN2BCD units (686), an initial BIN2BCD unit (685), a final BCD multiplier (684) and multiple intermediate BCD multipliers (683A, 683B, 683C, 683D), and multiple composite BCD adder tree units (i.e., Composite BCD Adder Tree Unit A (689), Composite BCD Adder Tree Unit B (690)). As shown in FIG. 6C, the binary/BCD hardware converter (611) inputs a binary input vector (695) and outputs a BCD output vector (694). The binary input vector (695), the binary/BCD hardware converter (611), and the BCD output vector (694) are essentially the same as the binary input vector (299), the binary/BCD hardware converter (210), and the BCD output vector (298), respectively, discussed above in reference to FIG. 2. In other words, the BCD output vector (694) is a BCD representation of the binary input vector (695).

In one or more embodiments of the invention, the binary/BCD hardware converter (611) partitions the binary input vector (695) into an initial segment, a final segment, and four intermediate segments. The initial segment, the final segment, and the four intermediate segments are the inputs into the initial BIN2BCD unit (685), the final BIN2BCD unit (687), and the multiple intermediate BIN2BCD units (686), respectively. The initial BIN2BCD unit (685), the final BIN2BCD unit (687), and each of the multiple intermediate BIN2BCD unit (686) are similar to the initial BIN2BCD unit (518), the final BIN2BCD unit (514), and the intermediate BIN2BCD unit (516), respectively, discussed above in reference to FIG. 5A, but have different numbers of input sizes, decoding unit stages, and number of E4 and/or E6 decoding blocks.

Still referring to FIG. 6C, the outputs of the final BIN2BCD unit (687) and the outputs of the four intermediate BIN2BCD units (686) are the inputs to the final BCD multiplier (684) and the four intermediate BCD multipliers (683A, 683B, 683C, 683D), respectively. The outputs of the BCD multipliers (684, 683A, 683B, 683C, 683D) and the output of the initial BIN2BCD unit (685) are the BCD vectors (693).

In one or more embodiments of the invention, the BCD vectors (693) are the inputs to the composite BCD adder tree units (689, 690). Each composite BCD adder tree unit (689, 690) corresponds to a carry-save adder tree with one or more correction units. The outputs of the composite BCD adder tree units (689, 690) are the input to carry-save adder tree. Finally, there is a decimal adder that outputs the BCD output vector (694).

Stored BCD Values Embodiments

Figure 7A:
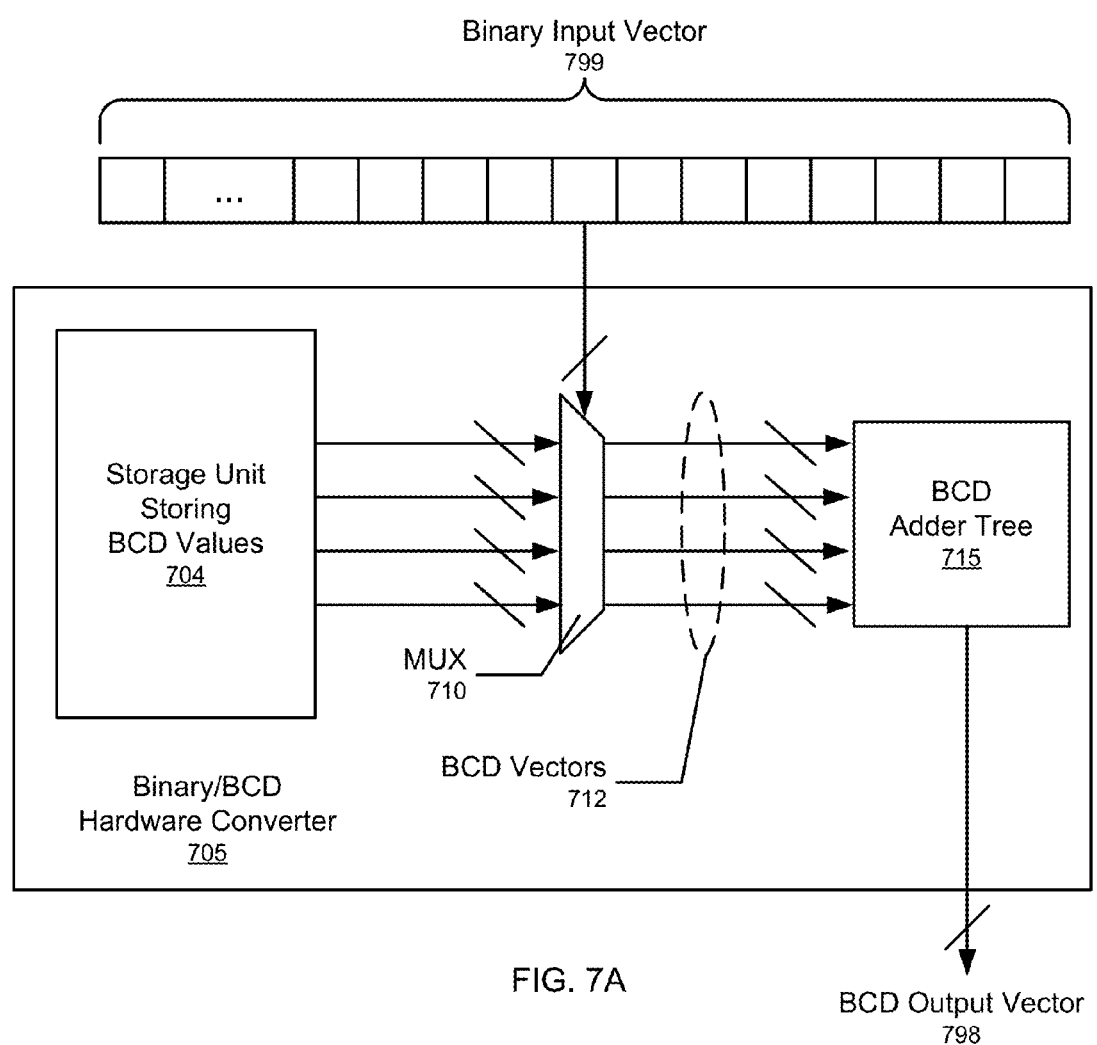
FIG. 7A shows a binary/BCD hardware converter in accordance with one or more embodiments of the invention.

FIG. 7A shows a binary/BCD hardware converter (705) in accordance with one or more embodiments of the invention. As shown in FIG. 7A, the binary/BCD hardware converter (705) has multiple components including: a storage unit (704), a multiplexer (i.e., MUX (710)), and a BCD adder tree (715). As also shown in FIG. 7A, the binary/BCD hardware converter (705) inputs the binary input vector (799) and outputs the BCD output vector (798). The binary input vector (799), the binary/BCD hardware converter (705), and the BCD output vector (798) correspond to the binary input vector (299), the binary/BCD hardware converter (210), and the BCD output vector (298), respectively, discussed above in reference to FIG. 2. In other words, the BCD output vector (798) is the BCD representation of the binary input vector (799).

In one or more embodiments of the invention, the binary/BCD hardware converter (705) includes the storage unit (704). The storage unit (704) stores BCD representations of various decimal powers of 2 (e.g., BCD representations of $2^0, 2^1, 2^2, \ldots, 2^{53}$, etc.). The storage unit (704) may be implemented using any type of memory.

In one or more embodiments of the invention, the binary/BCD hardware converter (705) includes the MUX (710). As shown in FIG. 7A, the MUX (710) inputs the stored BCD values and outputs multiple BCD vectors (712). As also shown in FIG. 7A, the binary input vector (799) is the selector signal for the MUX (710). Specifically, for each bit in the binary input vector (799), if the bit is non-zero, the MUX (710) outputs the stored BCD value corresponding to the position of the bit. If the bit is zero, the MUX (710) outputs 0. For example, if the binary input vector (799) is "001011", the MUX (710) outputs, in parallel, the BCD representations of 0, 0, $2^3$, 0, $2^1$, and $2^0$. An another example, if the binary input vector (799) is "011000", the MUX (710) outputs, in parallel, the BCD representations of 0, $2^4$, $2^3$, 0, 0, and 0. In other words, the MUX (710) outputs a subset of the BCD values stored in the storage unit (704) corresponding to the non-zeros bits in the binary input vector (799).

In one or more embodiments of the invention, the binary/BCD hardware converter (705) includes the BCD adder tree (715). The BCD adder tree (715) is configured to generate the BCD output vector (798) by summing the output of the MUX (710).

Figure 7B:
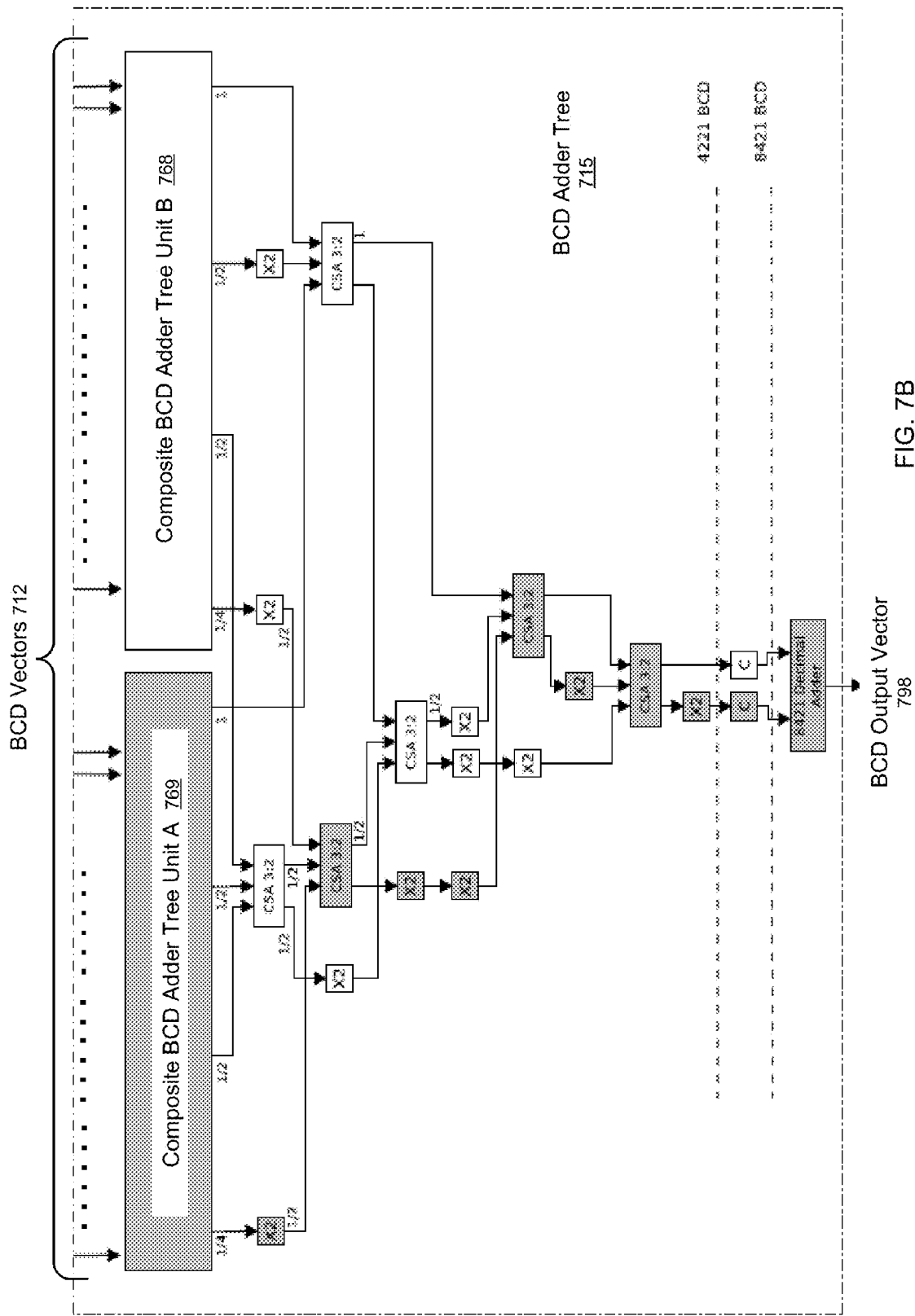
FIG. 7B shows a BCD adder tree in accordance with one or more embodiments of the invention.

FIG. 7B shows the BCD adder tree (715) in accordance with one or more embodiments of the invention. As shown in FIG. 7B, the BCD adder tree (715) inputs the BCD vectors (712) and outputs the BCD output vector (798). As also shown in FIG. 7B, the BCD adder tree (715) has multiple composite BCD adder tree units (i.e., composite BCD adder tree unit A (769), composite BCD adder tree unit B (768)), each corresponding to a carry-save adder tree with one or more correction units. The outputs of the composite BCD adder tree units (768, 769) are the input to carry-save adder tree. Finally, there is a decimal adder that outputs the BCD output vector (798).

The systems and processes described in this detailed description may be used in any application requiring decimal calculations, including (but not limited to) applications of: finance, taxation, investments, transportation, commerce, energy consumption, energy pricing/purchasing, etc. Moreover, any system and/or process described in this detailed description may be used to implement decimal function units including, for example, BID Adders, BID Multipliers, etc.

Figure 8:
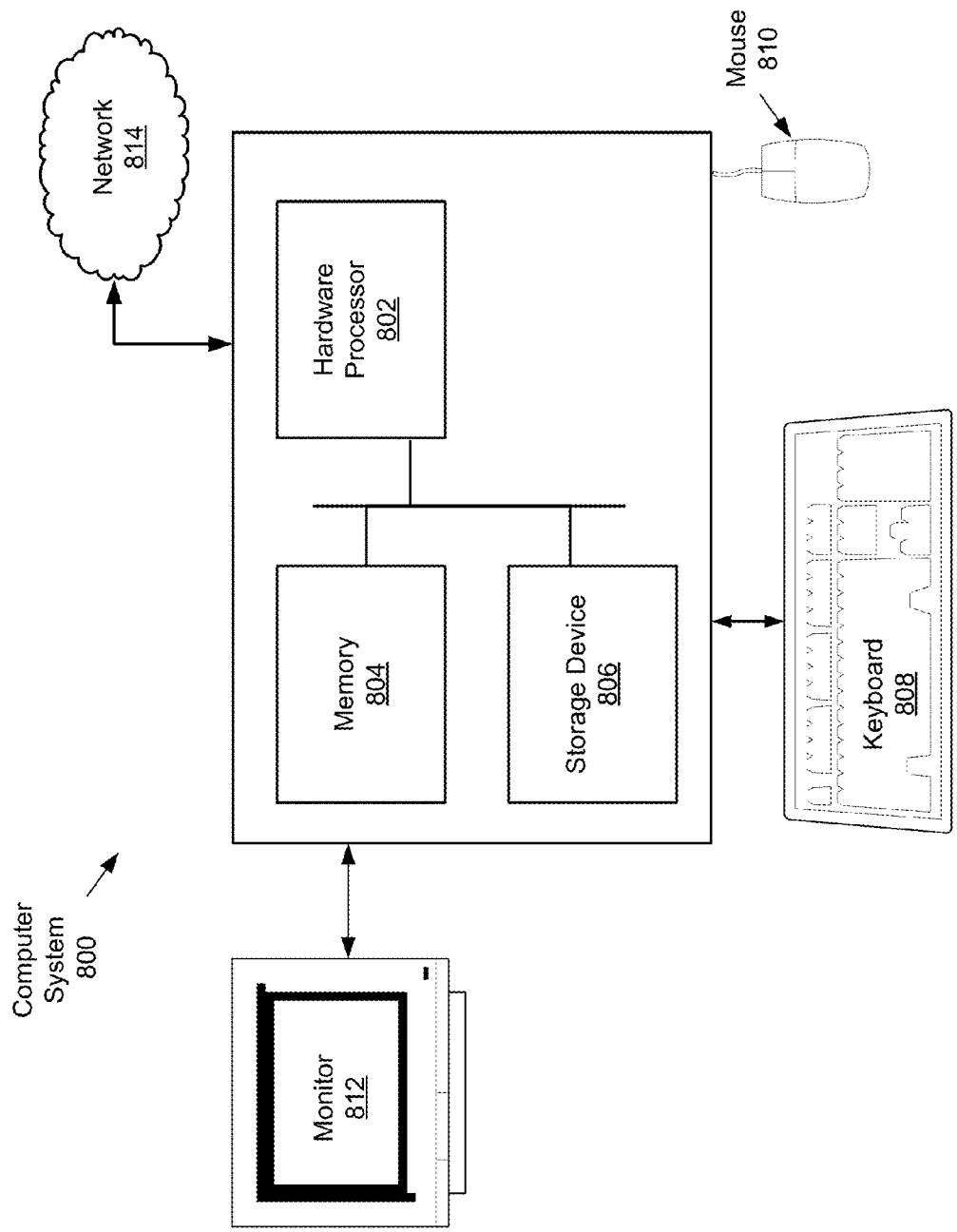
FIG. 8 shows a computer system in accordance with one or more embodiments of the invention.

Embodiments of the invention may be implemented on virtually any type of computer regardless of the platform being used. For example, as shown in FIG. 8, a computer system (800) includes one or more hardware processor(s) (802) (such as a central processing unit (CPU), integrated circuit, etc.), associated memory (804) (e.g., random access memory (RAM), cache memory, flash memory, etc.), a storage device (806) (e.g., a hard disk, an optical drive such as a compact disk drive or digital video disk (DVD) drive, a flash memory stick, etc.), and numerous other elements and functionalities typical of today's computers (not shown). One or more of the system (200) components (e.g., Significand Formulation Hardware Unit (205), Binary/BCD Hardware Converter (210), DPD Output Formulation Hardware Unit (215), Input Decoding Unit (220)) may be located on the hardware processor (802). The computer system (800) may also include input means, such as a keyboard (808), a mouse (810), or a microphone (not shown). Further, the computer system (800) may include output means, such as a monitor (812) (e.g., a liquid crystal display (LCD), a plasma display, or cathode ray tube (CRT) monitor). The computer system (800) may be connected to a network (814) (e.g., a local area network (LAN), a wide area network (WAN), the Internet, or any other type of network) via a network interface connection (not shown). Those skilled in the art will appreciate that many different types of computer systems exist, and the aforementioned input and output means may take other forms. Generally speaking, the computer system (800) includes at least the minimal processing, input, and/or output means necessary to practice embodiments of the invention.

Further, in one or more embodiments of the invention, one or more elements of the aforementioned computer system (800) may be located at a remote location and connected to the other elements over a network. Further, embodiments of the invention may be implemented on a distributed system having a plurality of nodes, where each portion of the invention may be located on a different node within the distributed system. In one embodiment of the invention, the node corresponds to a computer system. Alternatively, the node may correspond to a processor with associated physical memory. The node may alternatively correspond to a processor or micro-core of a processor with shared memory and/or resources. Further, software instructions in the form of computer readable program code to perform embodiments of the invention may be stored, temporarily or permanently, on a non-transitory computer readable storage medium, such as a compact disc (CD), a diskette, a tape, a hard drive, punch cards, memory, or any other tangible computer readable storage device.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A method, comprising:
    obtaining a binary input vector;
    generating, by a binary/binary coded decimal (BCD) hardware converter, a plurality of BCD vectors based on the binary input vector by:
        partitioning the binary input vector into at least an initial segment and a final segment;
        generating an initial BCD vector from the initial segment of the binary input vector; and
        generating a plurality of final BCD vectors from the final segment of the binary input vector,
        wherein the plurality of BCD vectors comprises the initial BCD vector and the plurality of final BCD vectors; and
    calculating a BCD output vector based on the plurality of BCD vectors.

2. The method of claim 1, further comprising:
    obtaining, by a significand formulation hardware unit (SFHU), a binary integer decimal (BID) encoding of a decimal floating point number, wherein the BID encoding comprises a partial significand field and a combination field;
    selecting, by the SFHU, a hidden bit based on the combination field; and
    generating, by the SFHU, the binary input vector by concatenating at least the hidden bit and the partial significand field.

3. The method of claim 2, further comprising:
    extracting an exponent from the BID encoding; and
    generating, by a densely packed decimal (DPD) output formulation hardware unit, a DPD encoding of the decimal floating point number based on the exponent and the BCD output vector.

4. The method of claim 2, wherein the BID encoding has a cardinality of 64 bits.

5. The method of claim 1, wherein generating the plurality of final BCD vectors comprises:
    generating, by an E6 decoding tree operatively connected to a plurality of stages of E4 decoding blocks, a final internal BCD vector and a plurality of multiples of the final internal BCD vector from the final binary segment, wherein each stage of the plurality of stages outputs a multiple of the plurality of multiples; and
    generating, from the plurality of multiples, a plurality of partial products corresponding to a first multiplication of the final internal BCD vector with a first constant,
    wherein the first constant is based on a least significant bit of the final binary segment, and
    wherein the plurality of final BCD vectors comprises the plurality of partial products corresponding to the first multiplication.

6. The method of claim 5, further comprising:
    generating a plurality of intermediate BCD vectors by:
        generating an intermediate internal BCD vector and a plurality of multiples of the intermediate internal BCD vector from an intermediate binary segment of the binary input vector; and
        generating, from the plurality of multiples of the intermediate internal BCD vector, a plurality of partial products corresponding to a second multiplication of the intermediate internal BCD vector with a second constant,
    wherein the second constant is based on a least significant bit of the intermediate binary segment,
    wherein the plurality of intermediate BCD vectors comprises the plurality of partial products corresponding to the second multiplication, and
    wherein the plurality of BCD vectors further comprises the plurality of intermediate BCD vectors.

7. The method of claim 6, wherein calculating the BCD output vector comprises summing the initial BCD vector, the plurality of intermediate BCD vectors, and the plurality of final BCD vectors.

8. A system, comprising:
    a binary/binary coded decimal (BCD) hardware converter comprising:
        an initial bin2BCD unit configured to generate an initial BCD vector based on an initial segment of a binary input vector; and
        a final bin2BCD unit configured to generate a final internal BCD vector and a plurality of multiples of the final internal BCD vector based on a final segment of the binary input vector,
    wherein the BCD hardware converter is configured to calculate a BCD output vector based on a plurality of BCD vectors comprising the initial BCD vector.

9. The system of claim 8, further comprising:
    a significand formulation hardware unit (SFHU) operatively connected to the binary/BCD hardware converter and configured to:
        obtain a binary integer decimal (BID) encoding corresponding to a decimal floating point number, wherein the BID encoding comprises a partial significand field and a combination field;

select a hidden bit based on the combination field; and
generate the binary input vector by concatenating at least the hidden bit and the partial significand field.

10. The system of claim 9, wherein the BID encoding has a cardinality of 64 bits.

11. The system of claim 9, further comprising:
a densely packed decimal (DPD) output formulation hardware unit operatively connected to the binary/BCD hardware converter and configured to:
generate a DPD encoding corresponding to the decimal floating point number based on the BCD output vector and an exponent extracted from the BID encoding.

12. The system of claim 8, wherein the final bin2BCD unit comprises:
an E6 decoding tree configured to input the final segment of the binary input vector; and
a plurality of stages of E4 decoding blocks operatively connected to the E6 decoding tree,
wherein each stage of the plurality of stages outputs a multiple of the plurality of multiples of the final internal BCD vector.

13. The system of claim 12, wherein the binary/BCD hardware converter further comprises:
an intermediate bin2BCD unit configured to generate an intermediate internal BCD vector and a plurality of multiples of the intermediate internal BCD vector based on an intermediate segment of the binary input vector;
an intermediate BCD multiplier configured to generate, from the plurality of multiples of the intermediate internal BCD vector, a plurality of partial products corresponding to a first multiplication of the intermediate internal BCD vector with a first constant; and
a final BCD multiplier configured to generate, from the plurality of multiples of the final internal BCD vector, a plurality of partial products corresponding to a second multiplication of the final internal BCD vector with a second constant,
wherein the first constant is based on a least significant bit of the intermediate segment,
wherein the second constant is based on a least significant bit of the final segment, and
wherein the plurality of BCD vectors further comprises the plurality of partial products corresponding to the first multiplication and the plurality of partial products corresponding to the second multiplication.

14. The system of claim 13, wherein the binary/BCD hardware converter further comprises a BCD adder tree configured to sum the plurality of BCD vectors.

15. A method, comprising:
obtaining a binary input vector;
generating, by a binary/binary coded decimal (BCD) hardware converter, a plurality of BCD vectors based on the binary input vector by:
partitioning, by the hardware converter, the binary input vector into at least an initial binary segment and a final binary segment;
generating a final internal BCD vector from the final binary segment;
generating a two multiple of the final internal BCD vector from a single shifted version of the final binary segment;
generating a four multiple of the final internal BCD vector from a double shifted version of the final binary segment;
generating an eight multiple of the final internal BCD vector from a triple shifted version of the final binary segment; and
generating, using at least one selected from a group consisting of the two multiple of the final internal BCD vector, the four multiple of the final internal BCD vector, and the eight multiple of the final internal BCD vector, a plurality of partial products corresponding to a multiplication of the final internal BCD vector with a constant,
wherein the constant is based on a least significant bit of the final binary segment, and
wherein the plurality of BCD vectors comprise the plurality of partial products; and
calculating a BCD output vector based on the plurality of BCD vectors.

16. The method of claim 15, further comprising:
obtaining, by a significand formulation hardware unit (SFHU), a binary integer decimal (BID) encoding of a decimal floating point number, wherein the BID encoding comprises a partial significand field and a combination field;
selecting, by the SFHU, a hidden bit based on the combination field;
generating, by the SFHU, the binary input vector by concatenating at least the hidden bit and the partial significand field;
extracting an exponent from the BID encoding; and
generating, by a densely packed decimal (DPD) output formulation hardware unit, a DPD encoding of the decimal floating point number based on the exponent and the BCD output vector.

17. A system, comprising:
a binary/binary coded decimal (BCD) hardware converter comprising:
an initial bin2BCD unit configured to generate an initial BCD vector based on an initial segment of a binary input vector;
a first final bin2BCD master module configured to generate a final internal BCD vector from a final binary segment of the binary input vector;
a second final bin2BCD master module configured to generate a two multiple of the final internal BCD vector from a single shifted version of the final binary segment;
a third final bin2BCD master module configured to generate a four multiple of the final internal BCD vector from a double shifted version of the final binary segment;
a fourth final bin2BCD master module configured to generate an eight multiple of the final internal BCD vector from a triple shifted version of the final binary segment; and
a final BCD multiplier configured to generate, using at least one selected from a group consisting of the two multiple, the four multiple, and the eight multiple, a plurality of partial products corresponding to a multiplication of the final internal BCD vector with a constant,
wherein the constant is based on a least significant bit of the final binary segment, and,
wherein the binary/BCD hardware converter is further configure to calculate a BCD output vector based on a plurality of BCD vectors comprising the plurality of partial products and the initial BCD vector.

18. The system of claim 17, wherein the binary/BCD hardware converter further comprises:
an intermediate bin2BCD unit configured to generate a plurality of intermediate BCD vectors based on an intermediate segment of the binary input vector;

an first BCD adder tree configured to generate a sum of at least the initial BCD vector and the plurality of intermediate BCD vectors; and an second BCD adder tree configured to generate the BCD output vector based on the plurality of partial products and the sum.

19. A system, comprising:
a binary/binary coded decimal (BCD) hardware converter comprising:
    a storage unit storing a plurality of BCD values for a plurality of decimal power of twos;
    a multiplexer configured to select a subset of the plurality of BCD values based on non-zero bits in a binary input vector,
    a BCD adder tree configured to produce a sum of the subset,
    wherein the binary/binary coded decimal (BCD) hardware converter is configured to generate a plurality of BCD vectors based on the binary input vector and calculate a BCD output vector based on the plurality of BCD vectors,
    wherein the plurality of BCD vectors comprises the subset, and
    wherein the BCD output vector comprises the sum.

20. The system of claim 19, further comprising:
a significand formulation hardware unit (SFHU) operatively connected to the binary/BCD hardware converter and configured to:
    obtain a binary integer decimal (BID) encoding corresponding to a decimal floating point number, wherein the BID encoding comprises a partial significand field and a combination field;
    select a hidden bit based on the combination field; and
    generate the binary input vector by concatenating at least the hidden bit and the partial significand field; and
a densely packed decimal (DPD) output formulation hardware unit operatively connected to the binary/BCD hardware converter and configured to:
    generate a DPD encoding corresponding to the decimal floating point number based on the BCD output vector and an exponent extracted from the BID encoding.

\* \* \* \* \*